United States Patent
Chainer et al.

(10) Patent No.: US 9,027,360 B2
(45) Date of Patent: May 12, 2015

(54) THERMOELECTRIC-ENHANCED, LIQUID-BASED COOLING OF A MULTI-COMPONENT ELECTRONIC SYSTEM

(75) Inventors: Timothy J. Chainer, Putnam Valley, NY (US); David P. Graybill, Staatsburg, NY (US); Madhusudan K. Iyengar, Woodstock, NY (US); Vinod Kamath, Raleigh, NC (US); Bejoy J. Kochuparambil, Apex, NC (US); Roger R. Schmidt, Poughkeepsie, NY (US); Mark E. Steinke, Durham, NC (US)

(73) Assignee: International Business Machines Corporation, Armonk, NY (US)

( * ) Notice: Subject to any disclaimer, the term of this patent is extended or adjusted under 35 U.S.C. 154(b) by 438 days.

(21) Appl. No.: 13/102,195

(22) Filed: May 6, 2011

(65) Prior Publication Data
US 2012/0279233 A1 Nov. 8, 2012

(51) Int. Cl.
*F25D 23/12* (2006.01)
*F25D 17/06* (2006.01)

(52) U.S. Cl.
CPC ...................................... *F25D 17/06* (2013.01)

(58) Field of Classification Search
CPC . H05K 7/20; H05K 7/20154; H05K 7/20254; H05K 7/20218; H05K 7/20272; H05K 7/2039
USPC ......... 62/259.2, 3.6, 3.2; 165/104.11, 104.33; 361/688, 679.47, 702
See application file for complete search history.

(56) References Cited

U.S. PATENT DOCUMENTS 3,807,493 A 4/1974 Stewart
5,168,921 A 12/1992 Meyer
(Continued)

FOREIGN PATENT DOCUMENTS

CN 201222836 Y 4/2009
DE 199 25 983 A1 12/2000
(Continued)

OTHER PUBLICATIONS

Chainer et al., Office Action for U.S. Appl. No. 13/102,211, filed May 6, 2011, dated Oct. 4, 2012.
(Continued)

*Primary Examiner* — Cheryl J Tyler
*Assistant Examiner* — Ana Vazquez
(74) *Attorney, Agent, or Firm* — Margaret A. McNamara, Esq.; Kevin P. Radigan, Esq.; Heslin Rothenberg Farley & Mesiti P.C.

(57) ABSTRACT

Apparatus and method are provided for facilitating cooling of an electronic component. The apparatus includes a liquid-cooled structure, a thermal conduction path coupling the electronic component and the liquid-cooled structure, a coolant loop in fluid communication with a coolant-carrying channel of the liquid-cooled structure, and an outdoor-air-cooled heat exchange unit coupled to facilitate heat transfer from the liquid-cooled structure via, at least in part, the coolant loop. The thermoelectric array facilitates transfer of heat from the electronic component to the liquid-cooled structure, and the heat exchange unit cools coolant passing through the coolant loop by dissipating heat from the coolant to outdoor ambient air. In one implementation, temperature of coolant entering the liquid-cooled structure is greater than temperature of the outdoor ambient air to which heat is dissipated.

17 Claims, 22 Drawing Sheets

(56) References Cited

U.S. PATENT DOCUMENTS

| | | | |
|---|---|---|---|
| 5,414,591 A | 5/1995 | Kumura et al. | |
| 5,794,454 A | 8/1998 | Harris et al. | |
| 6,263,959 B1 | 7/2001 | Ikeda et al. | |
| 6,305,180 B1 | 10/2001 | Miller et al. | |
| 6,411,512 B1 | 6/2002 | Mankaruse et al. | |
| 6,434,000 B1 | 8/2002 | Pandolfi et al. | |
| 6,462,949 B1 | 10/2002 | Parish et al. | |
| 6,480,014 B1 | 11/2002 | Li et al. | |
| 6,548,894 B2* | 4/2003 | Chu et al. | 257/706 |
| 6,557,354 B1 | 5/2003 | Chu et al. | |
| 6,775,137 B2 | 8/2004 | Chu et al. | |
| 6,924,981 B2 | 8/2005 | Chu et al. | |
| 6,934,118 B2 | 8/2005 | Hidaka et al. | |
| 7,002,799 B2 | 2/2006 | Malone et al. | |
| 7,042,726 B2 | 5/2006 | Cader et al. | |
| 7,151,668 B1 | 12/2006 | Stathakis | |
| 7,165,412 B1 | 1/2007 | Bean, Jr. | |
| 7,221,569 B2 | 5/2007 | Tsai | |
| 7,233,501 B1 | 6/2007 | Ingalz | |
| 7,273,090 B2 | 9/2007 | Crocker et al. | |
| 7,286,355 B2 | 10/2007 | Cheon | |
| 7,361,985 B2 | 4/2008 | Yuan et al. | |
| 7,365,985 B1 | 4/2008 | Ni | |
| 7,385,810 B2 | 6/2008 | Chu et al. | |
| 7,388,749 B1 | 6/2008 | Feroli et al. | |
| 7,395,851 B2* | 7/2008 | Lee et al. | 165/80.3 |
| 7,420,804 B2 | 9/2008 | Leija et al. | |
| 7,436,663 B2 | 10/2008 | Matsushima et al. | |
| 7,440,278 B2 | 10/2008 | Cheng | |
| 7,443,672 B2 | 10/2008 | Peng et al. | |
| 7,450,385 B1 | 11/2008 | Campbell et al. | |
| 7,469,551 B2 | 12/2008 | Tilton et al. | |
| 7,522,418 B2 | 4/2009 | Ishimine | |
| 7,551,440 B2 | 6/2009 | Belady et al. | |
| 7,573,714 B2 | 8/2009 | Ali | |
| 7,595,550 B2 | 9/2009 | Cady et al. | |
| 7,626,820 B1 | 12/2009 | Konshak et al. | |
| 7,660,109 B2 | 2/2010 | Iyengar et al. | |
| 7,684,196 B2 | 3/2010 | Eckberg et al. | |
| 7,701,714 B2 | 4/2010 | Shabany | |
| 7,703,291 B2 | 4/2010 | Bushnik et al. | |
| 7,746,634 B2 | 6/2010 | Hom et al. | |
| 7,746,642 B2 | 6/2010 | Lai et al. | |
| 7,791,881 B2 | 9/2010 | Chou et al. | |
| 7,791,882 B2 | 9/2010 | Chu et al. | |
| 7,796,393 B2 | 9/2010 | Lengen et al. | |
| 7,796,399 B2 | 9/2010 | Clayton et al. | |
| 7,817,412 B2 | 10/2010 | Sullivan | |
| 7,830,657 B2 | 11/2010 | Chu et al. | |
| 7,855,890 B2 | 12/2010 | Kashirajima et al. | |
| 7,950,244 B2 | 5/2011 | Iyengar et al. | |
| 7,969,736 B1 | 6/2011 | Iyengar et al. | |
| 7,986,528 B2 | 7/2011 | Aoki | |
| 7,990,709 B2 | 8/2011 | Campbell et al. | |
| 8,018,718 B2 | 9/2011 | Goth et al. | |
| 8,027,162 B2 | 9/2011 | Campbell et al. | |
| 8,035,972 B2 | 10/2011 | Ostwald et al. | |
| 8,170,724 B2 | 5/2012 | Kelly et al. | |
| 8,208,258 B2 | 6/2012 | Campbell et al. | |
| 8,274,787 B2 | 9/2012 | Alyaser et al. | |
| 8,351,206 B2 | 1/2013 | Campbell et al. | |
| 8,437,129 B2 | 5/2013 | Tung et al. | |
| 8,599,557 B2 | 12/2013 | Peterson et al. | |
| 8,760,855 B2 | 6/2014 | Howes et al. | |
| 8,867,205 B2 | 10/2014 | Eagle | |
| 2001/0000880 A1* | 5/2001 | Chu et al. | 165/263 |
| 2004/0250989 A1 | 12/2004 | Im et al. | |
| 2005/0068728 A1* | 3/2005 | Chu et al. | 361/690 |
| 2005/0180113 A1 | 8/2005 | Shirakami et al. | |
| 2006/0146497 A1 | 7/2006 | Gauche et al. | |
| 2006/0221578 A1 | 10/2006 | Foster et al. | |
| 2006/0250770 A1 | 11/2006 | Campbell et al. | |
| 2006/0250772 A1 | 11/2006 | Salmonson et al. | |
| 2007/0034356 A1* | 2/2007 | Kenny et al. | 165/80.4 |
| 2007/0146990 A1 | 6/2007 | Hsieh | |
| 2007/0227708 A1 | 10/2007 | Hom et al. | |
| 2007/0227709 A1* | 10/2007 | Upadhya et al. | 165/121 |
| 2007/0263356 A1* | 11/2007 | Weber et al. | 361/700 |
| 2007/0263359 A1 | 11/2007 | Lai et al. | |
| 2007/0291452 A1 | 12/2007 | Gilliland et al. | |
| 2008/0060791 A1 | 3/2008 | Strobel et al. | |
| 2008/0101035 A1 | 5/2008 | Chen | |
| 2008/0112075 A1 | 5/2008 | Farquhar et al. | |
| 2008/0155990 A1* | 7/2008 | Gupta et al. | 62/3.2 |
| 2008/0239564 A1 | 10/2008 | Farquhar et al. | |
| 2008/0259566 A1 | 10/2008 | Fried | |
| 2008/0259567 A1* | 10/2008 | Campbell et al. | 361/699 |
| 2008/0310105 A1 | 12/2008 | Cheng | |
| 2009/0002951 A1 | 1/2009 | Legen et al. | |
| 2009/0080151 A1 | 3/2009 | Kalms et al. | |
| 2009/0086432 A1 | 4/2009 | Campbell et al. | |
| 2009/0120607 A1 | 5/2009 | Cheon et al. | |
| 2009/0122488 A1 | 5/2009 | Iyengar et al. | |
| 2009/0126909 A1 | 5/2009 | Ellsworth, Jr. et al. | |
| 2009/0133866 A1 | 5/2009 | Campbell et al. | |
| 2009/0190304 A1 | 7/2009 | Meyer et al. | |
| 2009/0201640 A1 | 8/2009 | Bard et al. | |
| 2009/0201644 A1 | 8/2009 | Kelly et al. | |
| 2009/0207564 A1 | 8/2009 | Campbell et al. | |
| 2009/0207567 A1 | 8/2009 | Campbell et al. | |
| 2009/0219687 A1 | 9/2009 | Lin | |
| 2009/0268404 A1 | 10/2009 | Chu et al. | |
| 2009/0277616 A1 | 11/2009 | Cipolla et al. | |
| 2009/0284924 A1 | 11/2009 | Konshak et al. | |
| 2010/0025010 A1 | 2/2010 | Cipolla et al. | |
| 2010/0027220 A1 | 2/2010 | Hughes et al. | |
| 2010/0085712 A1 | 4/2010 | Hrehor et al. | |
| 2010/0126696 A1 | 5/2010 | Novotny et al. | |
| 2010/0142147 A1 | 6/2010 | Chang et al. | |
| 2010/0149754 A1 | 6/2010 | Chapel et al. | |
| 2010/0252234 A1 | 10/2010 | Campbell et al. | |
| 2010/0263855 A1 | 10/2010 | Arimilli et al. | |
| 2010/0313590 A1 | 12/2010 | Campbell et al. | |
| 2011/0051372 A1 | 3/2011 | Barringer et al. | |
| 2011/0056674 A1 | 3/2011 | Campbell et al. | |
| 2011/0069454 A1 | 3/2011 | Campbell et al. | |
| 2011/0197612 A1 | 8/2011 | Campbell et al. | |
| 2011/0205705 A1 | 8/2011 | Graybill et al. | |
| 2011/0232889 A1 | 9/2011 | Eckberg et al. | |
| 2011/0313576 A1 | 12/2011 | Nicewonger | |
| 2011/0315353 A1 | 12/2011 | Campbell et al. | |
| 2012/0026670 A1 | 2/2012 | Fau et al. | |
| 2012/0279047 A1 | 11/2012 | Chainer et al. | |
| 2012/0279686 A1 | 11/2012 | Chainer et al. | |
| 2012/0281358 A1 | 11/2012 | Chainer et al. | |
| 2012/0281359 A1 | 11/2012 | Arney et al. | |
| 2013/0342987 A1 | 12/2012 | Yang et al. | |
| 2013/0343005 A1 | 12/2012 | David et al. | |
| 2013/0107453 A1 | 5/2013 | Chainer et al. | |
| 2013/0135812 A1 | 5/2013 | Barina et al. | |
| 2013/0174421 A1 | 7/2013 | Chainer et al. | |
| 2013/0194745 A1 | 8/2013 | Meijer et al. | |
| 2014/0069111 A1 | 3/2014 | Campbell et al. | |
| 2014/0123493 A1 | 5/2014 | Campbell et al. | |

FOREIGN PATENT DOCUMENTS

| | | |
|---|---|---|
| EP | 2 357 878 A2 | 1/2011 |
| JP | 01077199 A | 3/1989 |
| JP | 2010040886 A | 2/2010 |
| TW | 323643 U | 12/2007 |
| TW | 200937175 A | 9/2009 |

OTHER PUBLICATIONS

IBM Technical Disclosure, "Highly-Efficient Copper Rail Design for Optimized Cooling of DRAM Modules", IPCOM000184053D (Jun. 9, 2009).

Office Action for U.S. Appl. No. 12/566,081 (U.S. Patent Publication No. 2011/0069454 A1), dated Jan. 14, 2011.

Notice of Allowance for U.S. Appl. No. 12/566,081 (U.S. Patent Publication No. 2011/0069454 A1), dated May 20, 2011.

(56) References Cited

OTHER PUBLICATIONS

Chainer et al., Notice of Allowance for U.S. Appl. No. 13/451,714, filed Apr. 20, 2012 (U.S. Patent Publication No. 2012/0279047 A1), dated Jun. 14, 2013 (p. 1-40).
Search Report issued by the Great Britain Intellectual Property Office (IPO) for GB Application No. 1216684.9, dated Jan. 14, 2013.
Notification of Transmittal of the International Search Report and the Written Opinion, issued for PCT Application No. PCT/EP2012/068516, dated Mar. 26, 2013 (10 pages).
Chainer et al., Notice of Allowance for U.S. Appl. No. 13/283,933, filed Oct. 28, 2011 (U.S. Patent Publication No. 2013/0107453 A1), dated Aug. 26, 2013 (23 pgs.).
Chainer et al., Notice of Allowance for U.S. Appl. No. 13/451,714, filed Apr. 20, 2012 (U.S. Patent Publication No. 2012/0279047 A1), dated Aug. 27, 2013 (19 pgs.).
Chainer et al., Notice of Allowance for U.S. Appl. No. 13/283,933, filed Oct. 28, 2011 (U.S. Patent Publication No. 2013/0107453 A1), dated Nov. 12, 2013 (16 pages).
Chainer et al., Office Action for U.S. Appl. No. 13/102,200, filed May 6, 2011 (U.S. Patent Publication No. 2012/0279686 A1), dated Nov. 25, 2013 (48 pages).
O'Connor, Dan, "A Process Control Primer", Honeywell, Sensing and Control, Revision 1, Jul. 2000 (144 pages).

* cited by examiner

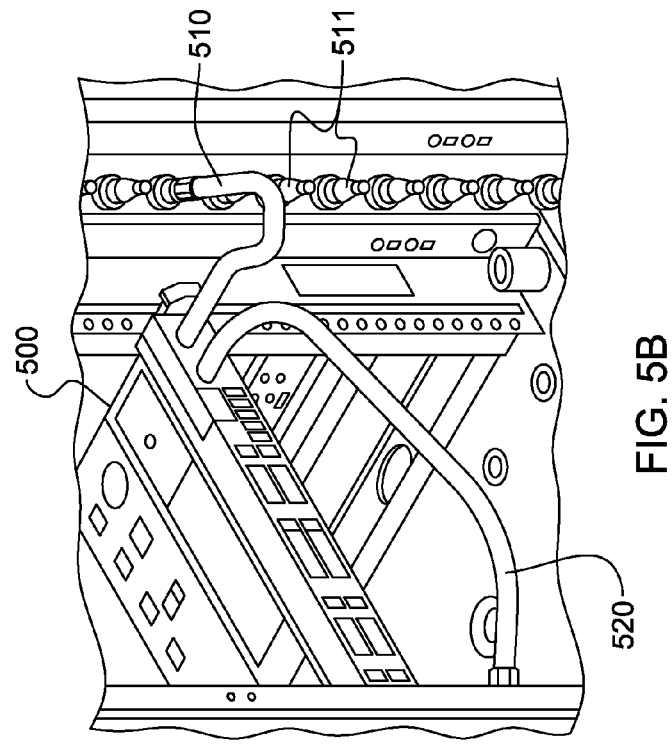
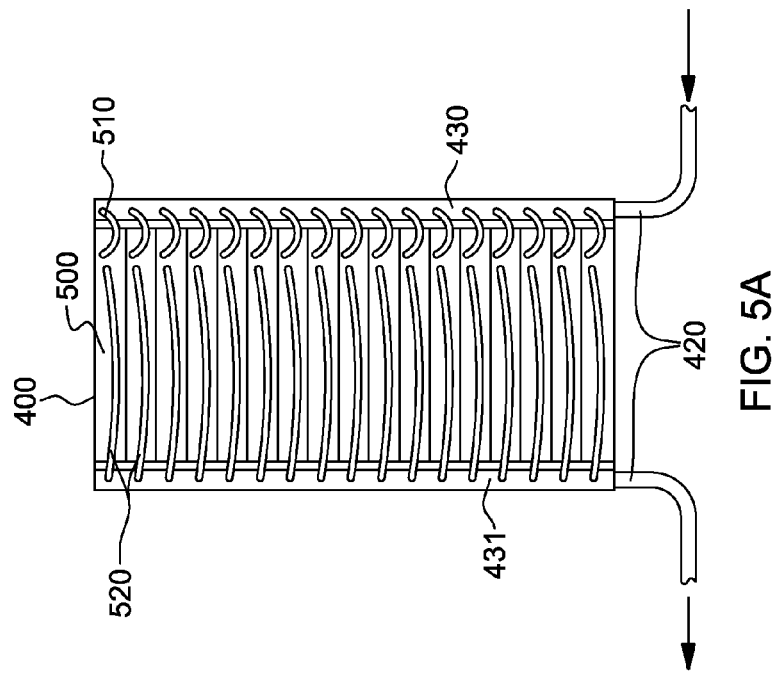
FIG. 5B
FIG. 5A

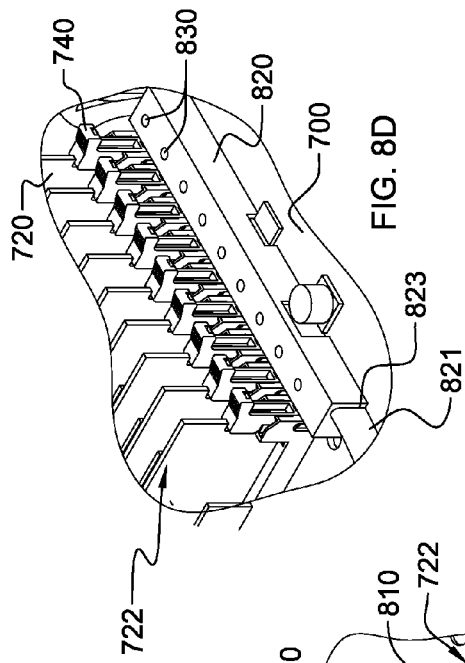
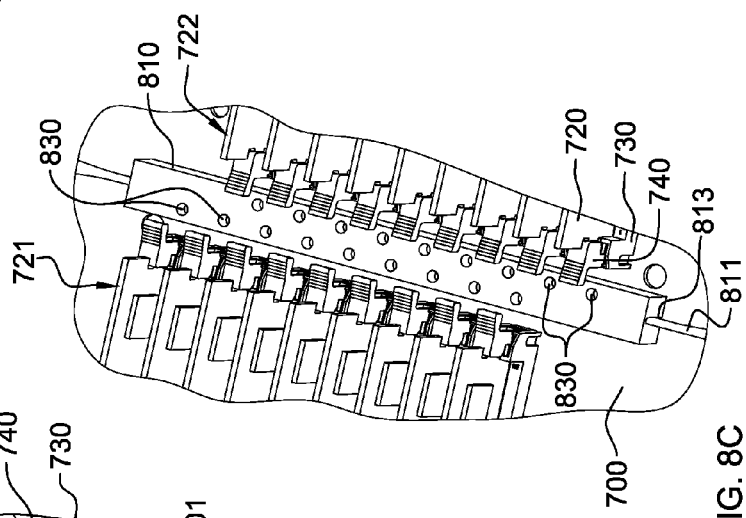
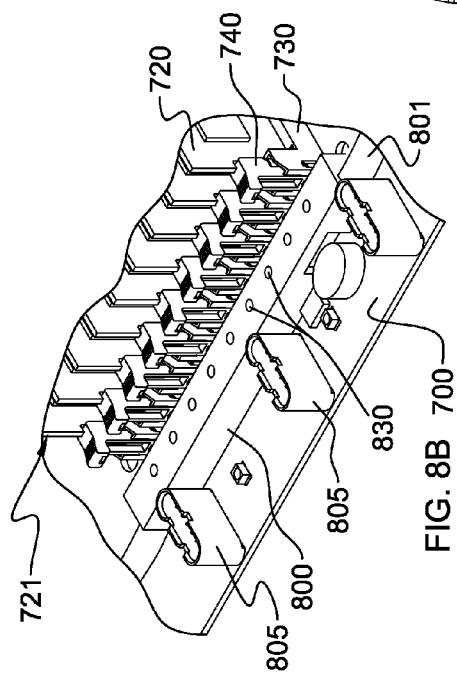

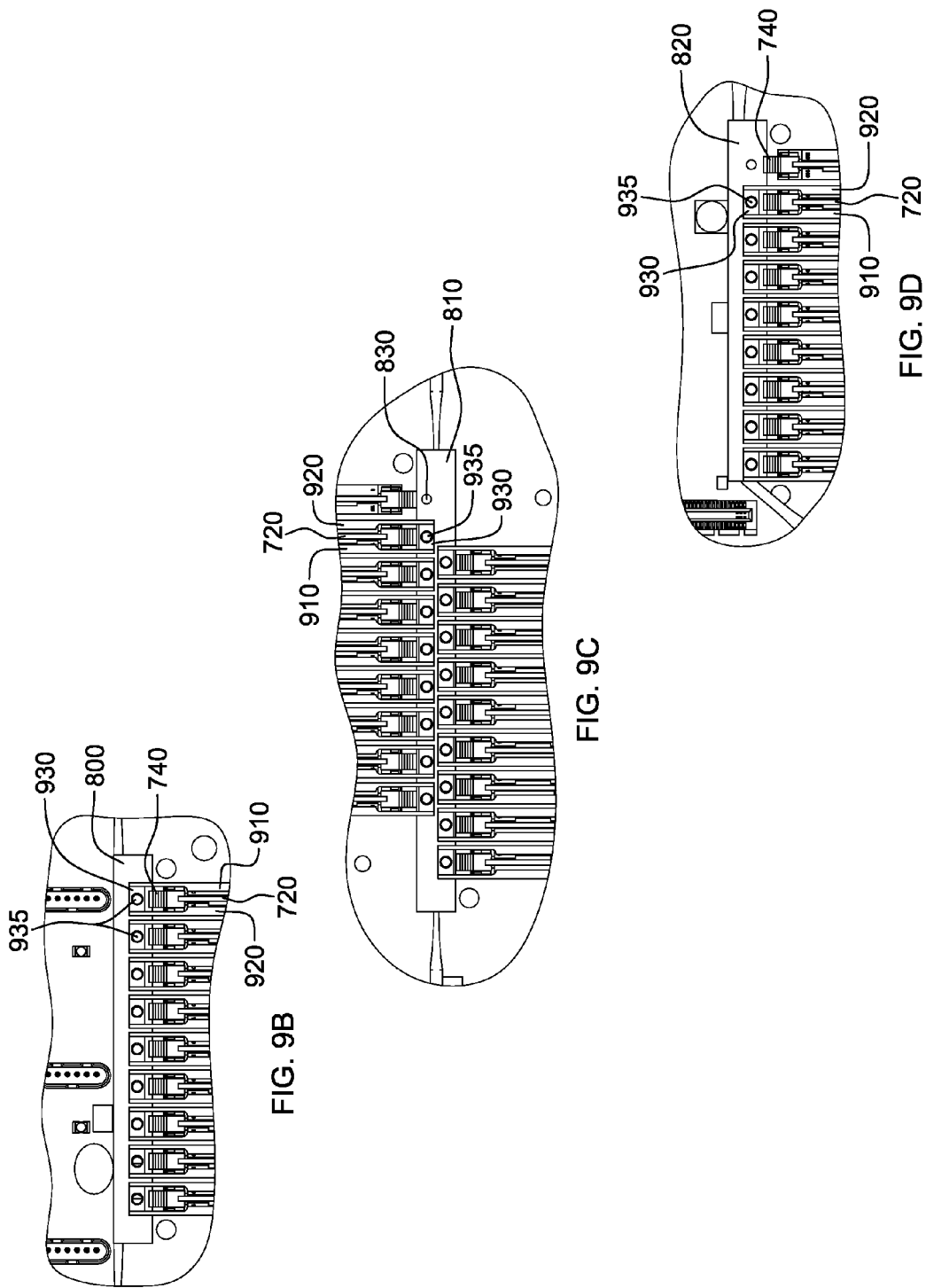

THERMOELECTRIC-ENHANCED, LIQUID-BASED COOLING OF A MULTI-COMPONENT ELECTRONIC SYSTEM

STATEMENT REGARDING FEDERALLY SPONSORED RESEARCH

This invention was made with Government support under Contract No. DE-EE0002894, awarded by the Department of Energy. Accordingly, the U.S. Government has certain rights in the invention.

BACKGROUND

As is known, operating electronic devices produce heat. This heat should be removed from the devices in order to maintain device junction temperatures within desirable limits, with failure to remove heat effectively resulting in increased device temperatures, potentially leading to thermal runaway conditions. Several trends in the electronics industry have combined to increase the importance of thermal management, including heat removal for electronic devices, including technologies where thermal management has traditionally been less of a concern, such as CMOS. In particular, the need for faster and more densely packed circuits has had a direct impact on the importance of thermal management. First, power dissipation, and therefore heat production, increases as device operating frequencies increase. Second, increased operating frequencies may be possible at lower device junction temperatures. Further, as more and more devices are packed onto a single chip, heat flux (Watts/cm$^2$) increases, resulting in the need to remove more power from a given size chip or module. These trends have combined to create applications where it is no longer desirable to remove heat from modern devices solely by traditional air cooling methods, such as by using air cooled heat sinks with heat pipes or vapor chambers. Such air cooling techniques are inherently limited in their ability to extract heat from an electronic device with high power density.

BRIEF SUMMARY

In one aspect, the shortcomings of the prior art are overcome and additional advantages are provided through the provision of a cooling apparatus for facilitating dissipation of heat from an electronic component of an electronic system. The cooling apparatus includes a liquid-cooled structure, a thermal conduction path, a coolant loop, and an outdoor-air-cooled heat exchange unit. The liquid-cooled structure includes a thermally conductive material and has at least one coolant-carrying channel extending therein. The thermal conduction path couples the electronic component and the liquid-cooled structure, and includes a thermoelectric array. The thermoelectric array, which includes at least one thermoelectric module facilitates transfer of heat from the electronic component to the liquid-cooled structure. The coolant loop is coupled in fluid communication with the at least one coolant-carrying channel extending within the liquid-cooled structure, and the outdoor-air-cooled heat exchange unit is coupled to facilitate heat transfer from the liquid-cooled structure, to the outdoor-air-cooled heat exchange unit via, at least in part, the coolant loop. The outdoor-air-cooled heat exchange unit cools coolant passing through the coolant loop by dissipating heat from the coolant to outdoor ambient air.

In another aspect, a cooled electronic system is provided which includes an electronic component, and a cooling apparatus for facilitating cooling of the electronic component. The cooling apparatus includes a liquid-cooled structure, a thermal conduction path, a coolant loop, and an outdoor-air-cooled heat exchange unit. The liquid-cooled structure includes a thermally conductive material and has at least one coolant-carrying channel extending therein. The thermal conduction path couples the electronic component and the liquid-cooled structure, and includes a thermoelectric array. The thermoelectric array, which includes at least one thermoelectric module, facilitates transfer of heat from the electronic component to the liquid-cooled structure. The coolant loop is coupled in fluid communication with the at least one coolant-carrying channel extending within the liquid-cooled structure, and the outdoor-air-cooled heat exchange unit is coupled to facilitate heat transfer from the liquid-cooled structure, to the outdoor-air-cooled heat exchange unit via, at least in part, the coolant loop. The outdoor-air-cooled heat exchange unit cools coolant passing through the coolant loop by dissipating heat from the coolant to outdoor ambient air.

Additional features and advantages are realized through the techniques of the present invention. Other embodiments and aspects of the invention are described in detail herein and are considered a part of the claimed invention.

BRIEF DESCRIPTION OF THE SEVERAL VIEWS OF THE DRAWINGS

One or more aspects of the present invention are particularly pointed out and distinctly claimed as examples in the claims at the conclusion of the specification. The foregoing and other objects, features, and advantages of the invention are apparent from the following detailed description taken in conjunction with the accompanying drawings in which:

FIG. 5A is a more detailed, elevational view of one embodiment of the liquid-cooled electronics rack of FIG. 4, and illustrating rack-level coolant distribution structures, in accordance with one or more aspects of the present invention;

FIG. 5B is a partial depiction of a more detailed embodiment of the rack-level coolant distribution structures illustrated in FIG. 5A, in accordance with one or more aspects of the present invention;

FIG. 8B is a partial depiction of the partially assembled cooled electronic system of FIG. 8A, and illustrating in greater detail, one embodiment of the first liquid-cooled cold rail disposed at one end of the parallel-disposed sockets that form part of the first array of electronics cards, in accordance with one or more aspects of the present invention;

FIG. 8C is a partial depiction of the second liquid-cooled cold rail disposed at the other end of the sockets comprising part of the first array of electronics cards, and shown disposed between the first and second arrays of electronics cards illustrated in FIG. 8A, in accordance with one or more aspects of the present invention;

FIG. 8D depicts one embodiment of the third liquid-cooled cold rail disposed at the other end of the sockets that form part of the second array of electronics cards illustrated in FIG. 8A, in accordance with one or more aspects of the present invention;

FIG. 9B is a partial depiction of the cooled electronic system of FIG. 9A, and illustrating interfacing of thermal spreaders to the first liquid-cooled cold rail at the one end of the sockets of the first array of electronics cards, in accordance with one or more aspects of the present invention;

FIG. 9C is a partial depiction of the cooled electronic system of FIG. 9A, and illustrating the second liquid-cooled cold rail disposed between the first and second arrays of electronics cards, and showing interfacing of thermal spreaders coupled to the first array of electronics cards, and thermal spreaders coupled to the second array of electronics cards to the second liquid-cooled cold rail, in accordance with one or more aspects of the present invention;

FIG. 9D is a partial depiction of the cooled electronic system of FIG. 9A, and illustrating interfacing of thermal spreaders associated with the second array of electronics cards to the third liquid-cooled cold rail of the cooled electronic system, in accordance with one or more aspects of the present invention;

DETAILED DESCRIPTION

Figure 1:
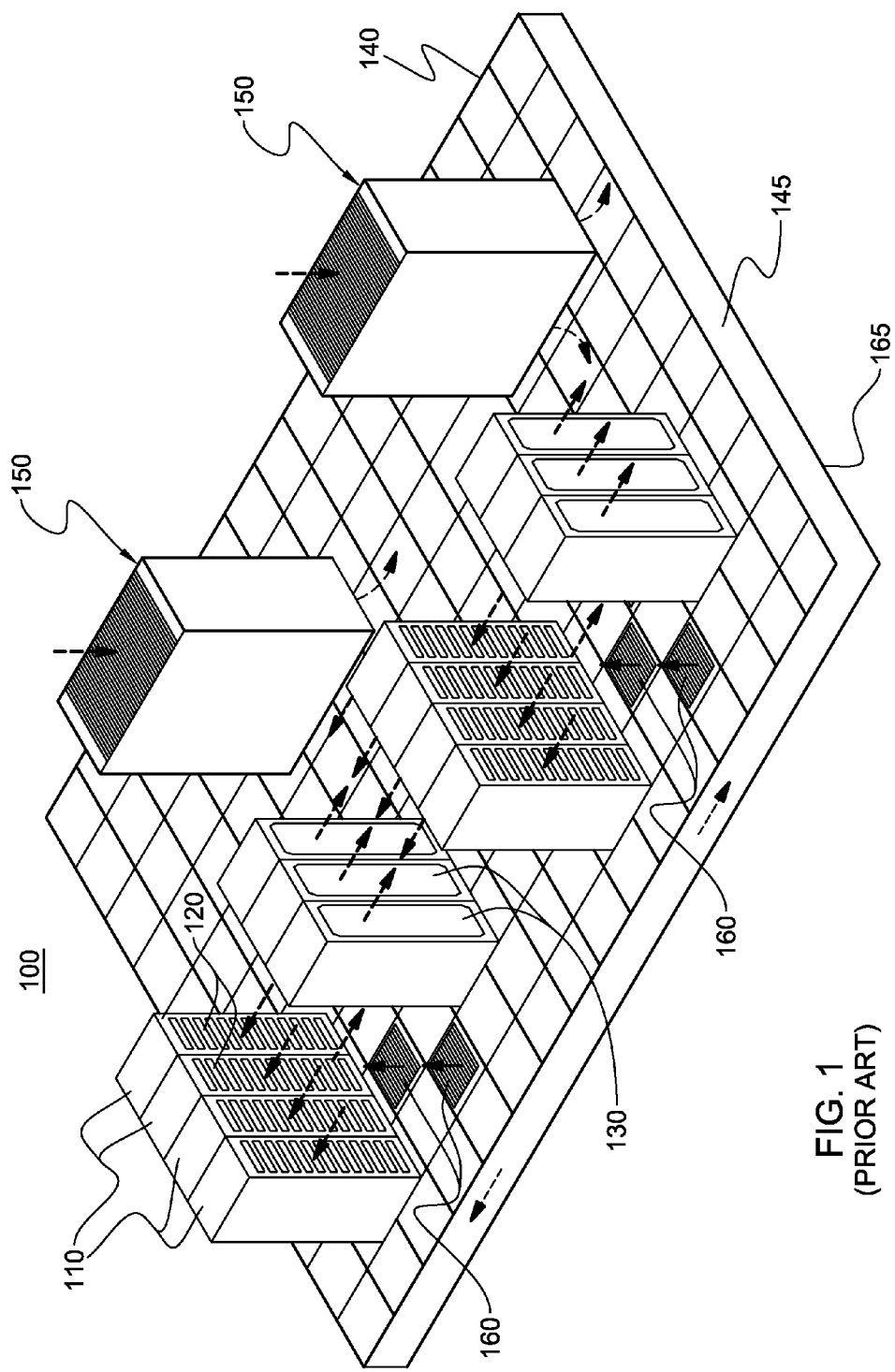
FIG. 1 depicts one embodiment of a conventional raised floor layout of an air-cooled data center.

As used herein, the terms "electronics rack", "rack-mounted electronic equipment", and "rack unit" are used interchangeably, and unless otherwise specified include any housing, frame, rack, compartment, blade server system, etc., having one or more heat generating components of a computer system or electronics system, and may be, for example, a stand-alone computer processor having high, mid or low end processing capability. In one embodiment, an electronics rack may comprise a portion of an electronic system, a single electronic system or multiple electronic systems, for example, in one or more sub-housings, blades, books, drawers, nodes, compartments, etc., having one or more heat-generating electronic components disposed therein. An electronic system(s) within an electronics rack may be movable or fixed relative to the electronics rack, with rack-mounted electronic drawers and blades of a blade center system being two examples of electronic systems (or subsystems) of an electronics rack to be cooled.

"Electronic component" refers to any heat-generating electronic component of, for example, a computer system or other electronic system requiring cooling. By way of example, an electronic component may comprise one or more integrated circuit dies, and/or other electronic devices to be cooled, such as one or more electronics cards comprising a plurality of memory modules (such as one or more dual in-line memory modules (DIMMs)), or one or more data storage devices (e.g., replaceable hard drives). As used herein "primary heat-generating component" refers to a primary heat-generating electronic component (such as an integrated circuit die) within an electronic system, while "secondary heat-generating component" refers to an electronic component (such as a replaceable disk drive) generating less heat than the primary heat-generating electronic component. By way of example, the primary heat-generating electronic component may generate, in one embodiment, two times or more heat than the secondary heat-generating component.

Further, as used herein, the terms "liquid-cooled structure", "liquid-cooled cold plate" and "liquid-cooled cold rail" refer to thermally conductive structures having one or more channels (or passageways) formed therein or passing therethrough, which facilitate the flow of liquid coolant through the structure. In one example, tubing is provided extending through the liquid-cooled cold plate or liquid-cooled cold rail. An "air-to-liquid heat exchanger" or "air-to-liquid heat exchange assembly" means any heat exchange mechanism characterized as described herein through which liquid coolant can circulate; and includes, one or more discrete air-to-liquid heat exchangers coupled either in series or in parallel. An air-to-liquid heat exchanger may comprise, for example, one or more coolant flow paths, formed of thermally conductive tubing (such as copper or other tubing) in thermal or mechanical contact with a plurality of air-cooled cooling fins. Size, configuration and construction of the air-to-liquid heat exchanger can vary without departing from the scope of the invention disclosed. Still further, "data center" refers to a computer installation containing one or more electronics racks to be cooled. As a specific example, a data center may comprise one or more rows of rack-mounted computer units, such as server units.

As used herein, the phrase "thermoelectric array" or "controllable thermoelectric array" refers to an adjustable thermoelectric array which allows active control of heat transfer across the thermoelectric array in a manner as described herein. In one example, the controllable thermoelectric array comprises one or more thermoelectric modules, each comprising one or more thermoelectric elements, coupled in a thermal conduction path to, for example, coolant passing through a liquid-cooled structure of the cooling apparatus disclosed herein, and powered by an adjustable electrical power source.

One example of coolant used within the cooled electronic apparatuses disclosed herein is water. However, the concepts presented are readily adapted to use with other types of coolant. For example, the coolant may comprise a brine, a fluorocarbon liquid, a liquid metal, or other similar coolant, or refrigerant, while still maintaining the advantages and unique features of the present invention.

Reference is made below to the drawings, which are not drawn to scale for reasons of understanding, wherein the same reference numbers used throughout different figures designate the same or similar components.

FIG. 1 depicts a raised floor layout of an air cooled data center 100 typical in the prior art, wherein multiple electronics racks 110 are disposed in one or more rows. A data center such as depicted in FIG. 1 may house several hundred, or even several thousand microprocessors. In the arrangement illustrated, chilled air enters the computer room via perforated floor tiles 160 from a supply air plenum 145 defined between the raised floor 140 and a base or sub-floor 165 of the room. Cooled air is taken in through louvered covers at air inlet sides 120 of the electronics racks and expelled through the back (i.e., air outlet sides 130) of the electronics racks. Each electronics rack 110 may have one or more air moving devices (e.g., fans or blowers) to provide forced inlet-to-outlet airflow to cool the electronic devices within the rack unit. The supply air plenum 145 provides conditioned and cooled air to the air-inlet sides of the electronics racks via perforated floor tiles 160 disposed in a "cold" aisle of the computer installation. The conditioned and cooled air is supplied to plenum 145 by one or more air conditioning units 150, also disposed within the data center 100. Room air is taken into each air conditioning unit 150 near an upper portion thereof. This room air may comprise, in part, exhausted air from the "hot" aisles of the computer installation defined, for example, by opposing air outlet sides 130 of the electronics racks 110.

Figure 2:
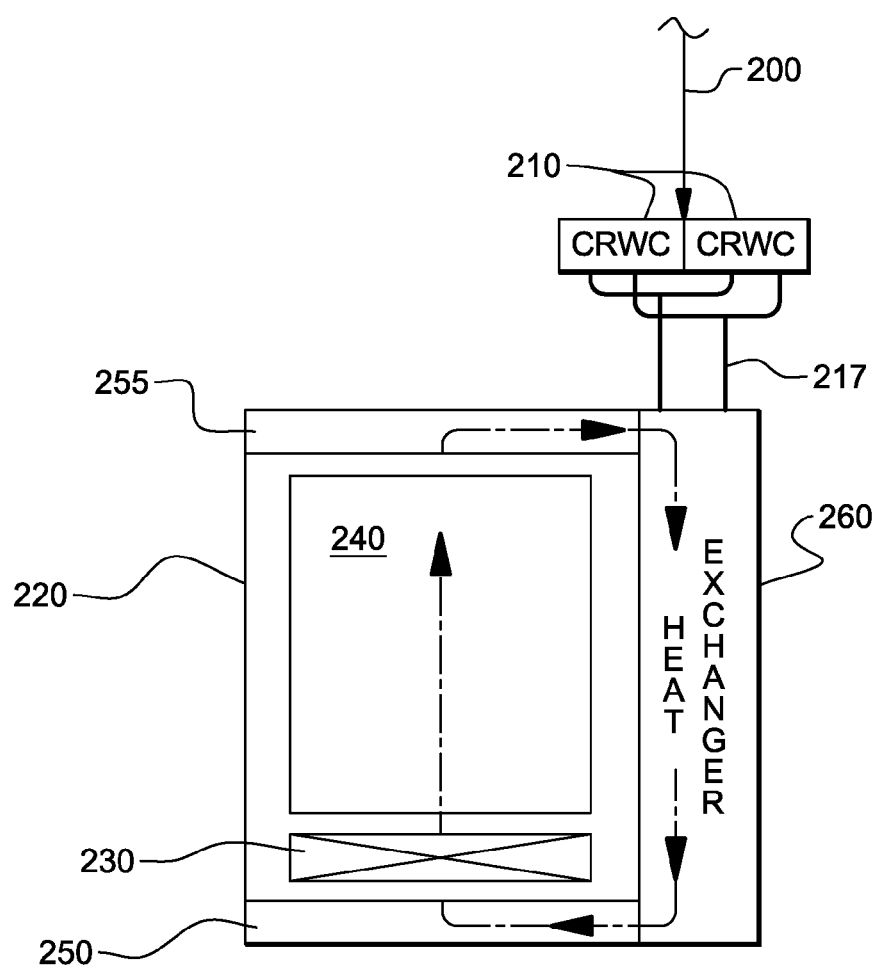
FIG. 2 is a cross-sectional plan view of one embodiment of an electronics rack with an attached air-to-liquid heat exchanger enhancing cooling of air passing through the electronics rack.
Figure 3:
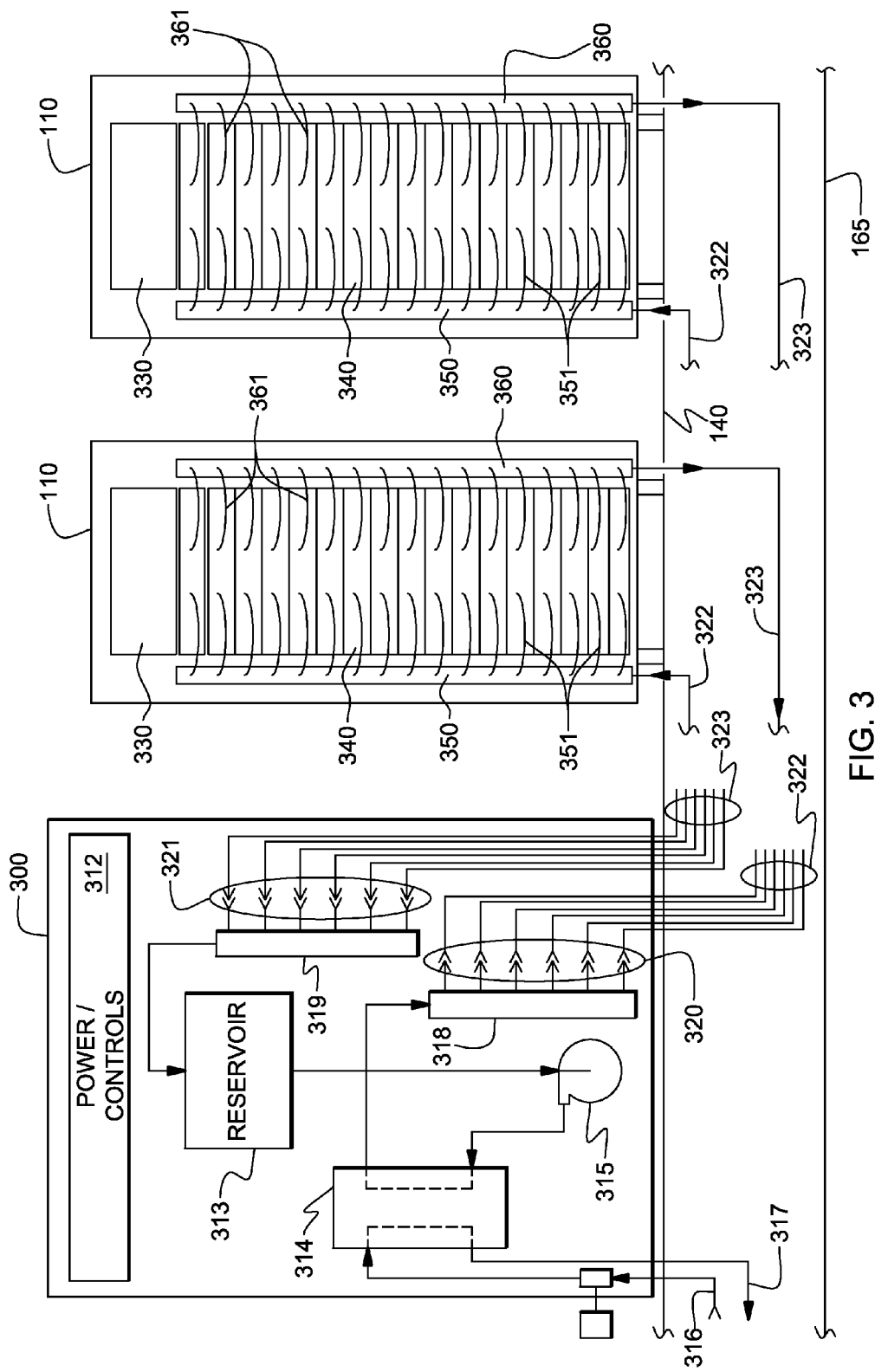
FIG. 3 depicts one embodiment of a data center with a coolant distribution unit facilitating liquid-cooling of one or more liquid-cooled electronics racks of the data center, in accordance with an aspect of the present invention.
Figure 4:
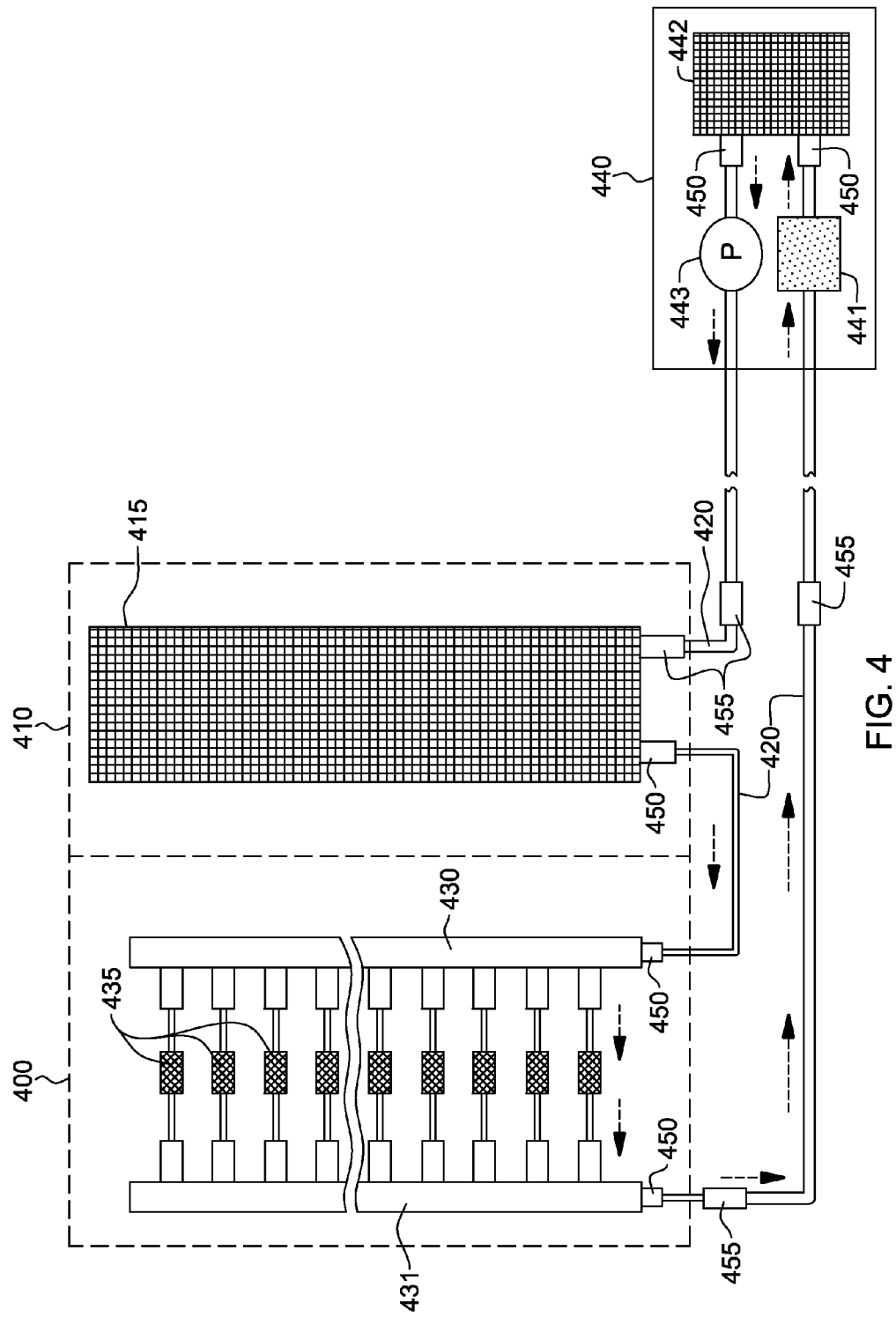
FIG. 4 depicts an alternate embodiment of a cooling apparatus and liquid-cooled electronics rack, in accordance with one or more aspects of the present invention.

Due to ever-increasing air flow requirements through electronics racks, and the limits of air distribution within a typical data center installation, liquid-based cooling is being combined with conventional air-cooling. FIGS. 2-4 illustrate various embodiments of a data center implementation employing a liquid-based cooling system.

FIG. 2 depicts one rack-level liquid-cooling solution which utilizes chilled facility water to remove heat from the computer installation room, thereby transferring the cooling burden from the air-conditioning unit(s) to the building's chilled water coolers. The embodiment depicted in FIG. 2 is described in detail in commonly assigned, U.S. Pat. No. 6,775,137. Briefly summarized, facility-chilled water 200 circulates through one or more liquid-to-liquid heat exchangers 210, coupled via a system coolant loop 211, to individual electronics racks 220 within the computer room. Rack unit 220 includes one or more air-moving devices 230 for moving air flow from an air inlet side to an air outlet side across one or more drawer units 240 containing heat-generating electronic components to be cooled. In this embodiment, a front cover 250 attached to the rack covers the air inlet side, a back cover 255 attached to the rack covers the air outlet side, and a side car disposed adjacent to (and/or attached to) the rack includes a heat exchanger 260 for cooling air circulating through the rack unit. Further, in this embodiment, the liquid-to-liquid heat exchangers 210 are multiple computer room water-conditioning (CRWC) units which are coupled to receive building chilled facility water 200. The building chilled facility water is used to cool the system coolant within system coolant loop 211, which is circulating through air-to-liquid heat exchanger 260. The rack unit in this example is assumed to comprise a substantially enclosed housing, wherein the same air circulates through the housing that passes across the air-to-liquid heat exchanger 260. In this manner, heat generated within the electronics rack is removed from the enclosed housing via the system coolant loop, and transferred to the facility coolant loop for removal from the computer installation room.

FIG. 3 depicts another embodiment of a rack-level, liquid-cooling solution, which again uses chilled facility water to remove heat from the computer installation room, thereby transferring the cooling burden from the air-conditioning unit(s) to the building's chilled water coolers. In this implementation, one embodiment of a coolant distribution unit 300 for a data center is illustrated. Within coolant distribution unit 300 is a power/control element 312, a reservoir/expansion tank 313, a liquid-to-liquid heat exchanger 314, a pump 315 (often accompanied by a redundant second pump), facility water inlet 316 and outlet 317 supply pipes, a supply manifold 318 supplying water or system coolant to the electronics racks 110 via couplings 320 and lines 322, and a return manifold 319 receiving water or system coolant from the electronics racks 110, via lines 323 and couplings 321. Each electronics rack includes (in one example) a power/control unit 330 for the electronics rack, multiple electronic systems or subsystems 340, a system coolant supply manifold 350, and a system coolant return manifold 360. As shown, each electronics rack 110 is disposed on raised floor 140 of the data center with lines 322 providing system coolant to system coolant supply manifolds 350 and lines 323 facilitating return of system coolant from system coolant return manifolds 360 being disposed in the supply air plenum beneath the raised floor.

In the embodiment illustrated, system coolant supply manifold 350 provides system coolant to cooling apparatuses disposed within the electronic systems or subsystems (for example, to liquid-cooled cold plates or cold rails) via flexible hose connections 351, which are disposed between the supply manifold and the respective electronic systems within the rack. Similarly, system coolant return manifold 360 is coupled to the electronic systems via flexible hose connections 361. Quick connect couplings may be employed at the interface between flexible hoses 351, 361 and the individual electronic systems. By way of example, these quick connect couplings may comprise various types of commercially available couplings, such as those available from Colder Products Company, of St. Paul, Minn., USA, or Parker Hannifin, of Cleveland, Ohio, USA.

Although not shown, electronics rack 110 may also include an air-to-liquid heat exchanger, for example, disposed at an air outlet side thereof, which also receives system coolant from the system coolant supply manifold 350 and returns system coolant to the system coolant return manifold 360.

FIG. 4 illustrates another embodiment of a liquid-cooled electronics rack and cooling system therefor, in accordance with one or more aspects of the present invention. In this embodiment, the electronics rack 400 has a side car structure 410 associated therewith or attached thereto, which includes an air-to-liquid heat exchanger 415 through which air circulates from an air outlet side of electronics rack 400 towards an air inlet side of electronics rack 400, for example, in a closed loop path in a manner similar to that illustrated above in connection with the cooling implementation of FIG. 2. In this example, the cooling system comprises an economizing-based, warm-liquid coolant loop 420, which comprises multiple coolant tubes (or lines) connecting, in the example depicted, air-to-liquid heat exchanger 415 in series fluid communication with a coolant supply manifold 430 associated with electronics rack 400, and connecting in series fluid communication, a coolant return manifold 431 associated with electronics rack 400, a cooling unit 440 of the cooling system, and air-to-liquid heat exchanger 415.

As illustrated, coolant flowing through warm-liquid coolant loop 420, after circulating through air-to-liquid heat exchanger 415, flows via coolant supply plenum 430 to one or more electronic systems of electronics rack 400, and in particular, one or more cold plates and/or cold rails 435 associated with the electronic systems, before returning via coolant return manifold 431 to warm-liquid coolant loop 420, and subsequently to cooling unit 440 disposed (for example) outdoors from the data center. In the embodiment illustrated, cooling unit 440 includes a filter 431 for filtering the circulating liquid coolant, a condenser (or air-to-liquid heat exchanger) 442 for removing heat from the liquid coolant, and a pump 443 for returning the liquid coolant through warm-liquid coolant loop 420 to air-to-liquid heat exchanger 415, and subsequently to the liquid-cooled electronics rack 400. By way of example, hose barb fittings 450 and quick disconnect couplings 455 may be employed to facilitate assembly or disassembly of warm-liquid coolant loop 420.

As used herein, "warm liquid cooling" or "warm coolant cooling" refers to a cooling approach employing an outdoor-air-cooled heat exchange unit as the cooling unit 440. This heat exchange unit is coupled via, at least in part, warm-liquid coolant loop 420 to dissipate heat from the coolant passing through the cold plates and/or cold rails 435 associated with the electronic systems. In the embodiment depicted, the heat is dissipated from the coolant to outdoor ambient air. Thus, temperature of the coolant within warm-liquid coolant loop 420 is greater than the temperature of the outdoor ambient air to which heat is dissipated. By way of specific example, temperature of the coolant entering the liquid-cooled structures within the electronic system may be greater than or equal to 27° C. and less than or equal to 45° C. In one specific example of the warm coolant-cooling approach of FIG. 4, ambient temperature might be 30° C., and coolant temperature 35° C. leaving the air-to-liquid heat exchanger 442 of the cooling unit. The cooled electronic system depicted thus facilitates a chiller-less data center. Advantageously, such a liquid-cooling solution provides highly energy efficient cooling of the electronic systems of the electronics rack, using liquid (e.g., water), that is cooled via circulation through the air-to-liquid heat exchanger located outdoors (i.e., a dry cooler) with external ambient air being pumped through the dry cooler. Note that this warm coolant-cooling approach of FIG. 4 is presented by way of example only. In alternate approaches, cold coolant-cooling could be substituted for the cooling unit 440 depicted in FIG. 4. Such cold coolant-cooling might employ building chilled facility coolant to cool the liquid coolant flowing through the liquid-cooled electronics rack, and associated air-to-liquid heat exchanger (if present), in a manner such as described above in connection with FIGS. 2 & 3.

FIGS. 5A & 5B depict in greater detail one embodiment of a liquid-cooled electronics rack, such as depicted in FIG. 4, in accordance with one or more aspects of the present invention. In this implementation, liquid-cooled electronics rack 400 comprises a plurality of electronic systems 500, within which one or more electronic components are to be liquid-cooled via, for example, one or more cold plates or cold rails, as described below. The cooling system includes coolant loop 420 coupled in fluid communication with coolant supply manifold 430 and coolant return manifold 431, both of which may comprise vertically-oriented manifolds attached to liquid-cooled electronics rack 400. In this embodiment, the rack-level coolant distribution system further includes individual node-level supply hoses 510 supplying coolant from coolant supply manifold 430 to cold plates and cold rails within the electronic systems 500. As shown in FIG. 5B, coolant supply manifold 430 may be (in one embodiment) a vertically-oriented manifold with a plurality of coupling connections 511 disposed along the manifold, one for each electronic system 500 having one or more electronic components to be liquid-cooled. Coolant leaves the individual electronic systems 500 via node-level return hoses 520, which couple the individual electronic systems (or nodes) to coolant return manifold 431, and hence, to coolant loop 420. In the embodiment illustrated in FIG. 4, relatively warm-liquid coolant, such as water, is supplied from the cooling unit, either directly, or through one or more air-to-liquid heat exchanger(s) 415 (of FIG. 4), and hot coolant is returned via the coolant return manifold to the cooling unit. In one embodiment of the rack-level coolant distribution system illustrated in FIGS. 5A & 5B, the node-level supply and return hoses 510, 520 are flexible hoses.

Figure 6:
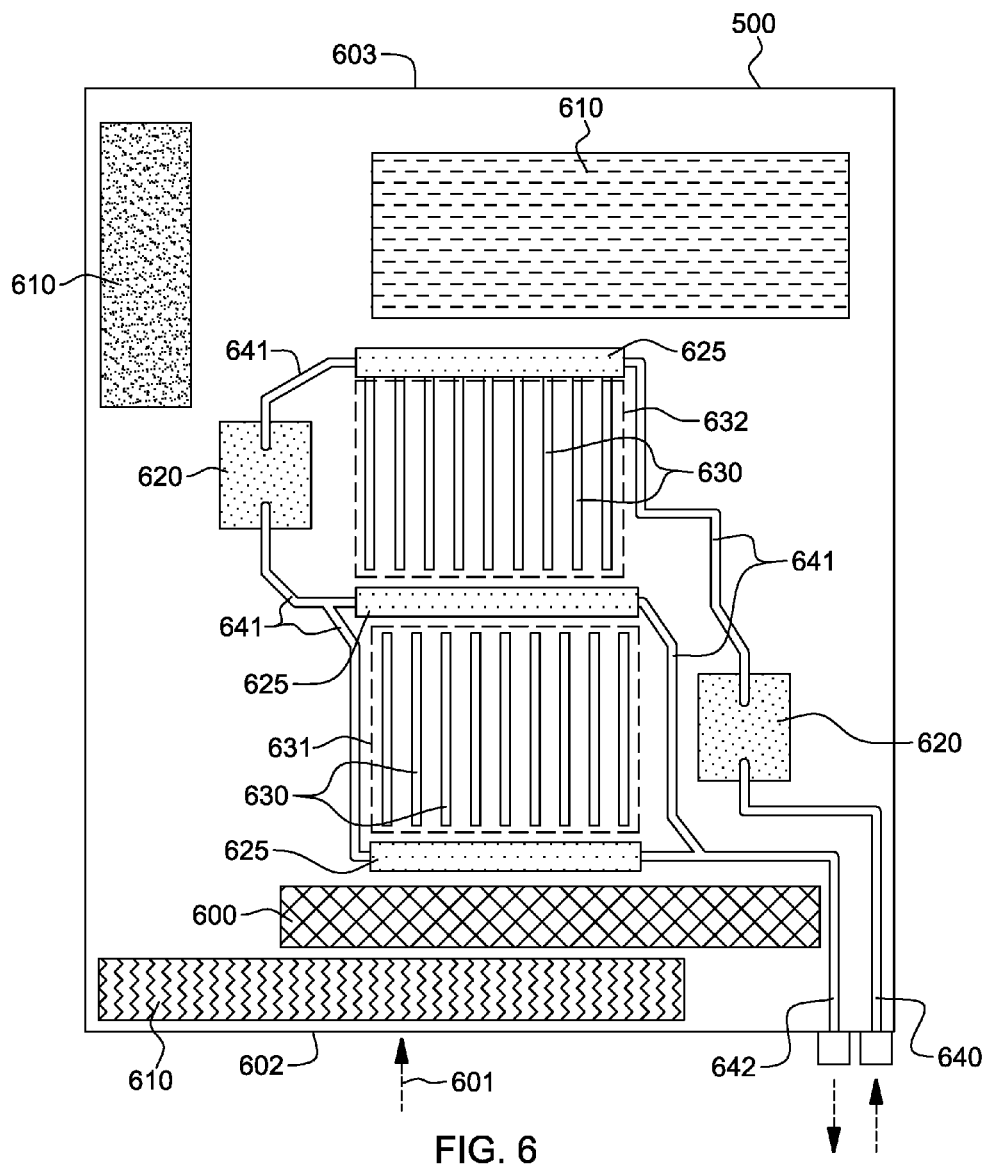
FIG. 6 is a plan view of one embodiment of an electronic system layout for a liquid-cooled electronics rack, and illustrating multiple liquid-cooled cold plates and multiple liquid-cooled cold rails coupled in fluid communication, in accordance with one or more aspects of the present invention.

FIG. 6 illustrates one embodiment of a cooled electronic system 500 component layout, wherein one or more air-moving devices 600 provide forced air flow 601 to cool multiple components 610 within electronic system 500. Cool air is taken in through a front 602 and exhausted out a back 603 of the electronic system (or drawer). The multiple components to be cooled include, for example, multiple processor modules to which liquid-cooled cold plates 620 (of the liquid-based cooling apparatus) are coupled, as well as multiple arrays 631, 632 of electronics cards 630 (e.g., memory modules such as dual in-line memory modules (DIMMs)), which are to be thermally coupled to one or more liquid-cooled cold rails 625. As used herein "thermally coupled" refers to a physical thermal transport path being established between components, for example, between an electronics card and a liquid-cooled cold rail for the conduction of heat from one to the other.

The illustrated liquid-based cooling approach further includes multiple coolant-carrying tubes connecting in fluid communication liquid-cooled cold plates 620 and liquid-cooled cold rails 625. These coolant-carrying tubes comprise (for example), a coolant supply tube 640, multiple bridge tubes 641, and a coolant return tube 642. In the embodiment illustrated, bridge tubes 641 connect one liquid-cooled cold rail 625 in series between the two liquid-cooled cold plates 620, and connect in parallel two additional liquid-cooled cold rails 625 between the second liquid-cooled cold plate 620 and the coolant return tube 642. Note that this configuration is provided by way of example only. The concepts disclosed herein may be readily adapted to use with various configurations of cooled electronic system layouts. Note also, that as depicted herein, the liquid-cooled cold rails are elongate, thermally conductive structures comprising one or more channels through which liquid coolant passes, for example, via one or more tubes extending through the structures. The liquid-cooled cold rails are disposed, in the embodiment illustrated, at the ends of the two arrays (or banks) 631, 632 of electronics cards 630, and multiple thermal spreaders are provided coupling in thermal communication electronics cards 630 and liquid-cooled cold rails 635. Various such thermal spreaders are discussed below with reference to FIGS. 8A-19C.

Figure 7:
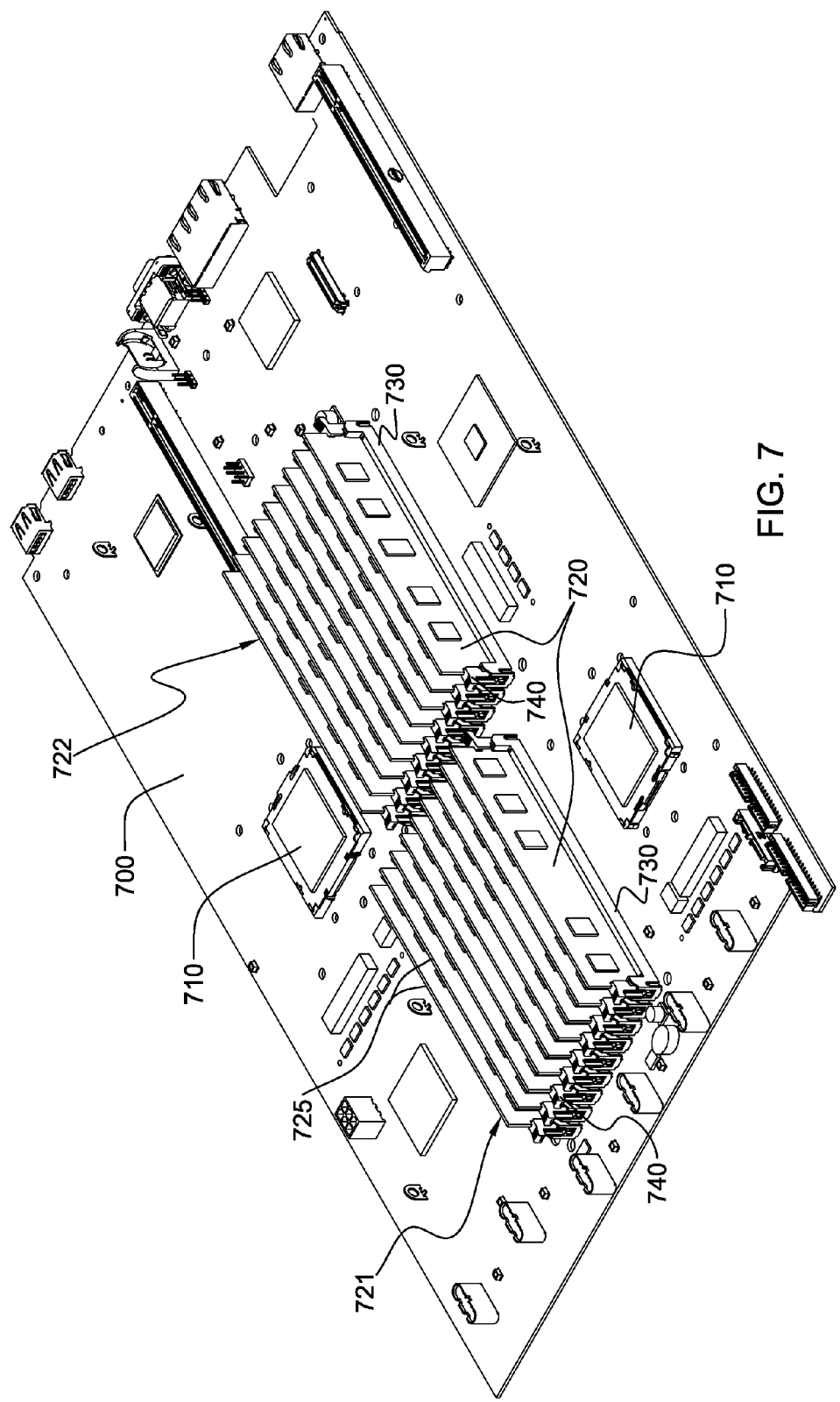
FIG. 7 depicts one detailed embodiment of a partially assembled electronic system, wherein the electronic system includes multiple different types of heat-generating electronic devices to be cooled, in accordance with one or more aspects of the present invention.

FIG. 7 depicts in greater detail one embodiment of an electronic system layout comprising a printed circuit board 700 with two processor modules 710, each of which is to have a respective liquid-cooled cold plate of a liquid-based cooling system coupled thereto, and multiple arrays 721, 722 of electronics cards 720, such as memory cards comprising memory modules on opposite first and second sides thereof. Electronics cards 720 are held in respective sockets 730, mounted to printed circuit board 700, and latches 740 at the ends of sockets 730 facilitate securing (or removing) of electronics cards 720 within (or from) the respective sockets 730. The cooling apparatus embodiments described hereinbelow advantageously facilitate liquid-cooling of electronics cards 720 without interfering with an operator's access to latches 740 at the ends of sockets 730. In addition to existing component constraints on the surface of printed circuit board 700, there is assumed to be negligible space between a cover (not shown) of the electronic system (e.g., server), and the top edge surfaces 721 of electronics cards 720.

FIGS. 8A-8D depicts a partial assembly of a cooled electronic system comprising the electronic system layout of FIG. 7, including printed circuit board 700, processor modules 710, and arrays 721, 722 of electronics cards 720. Electronics cards 720 are each shown positioned within a respective socket 730 mounted to printed circuit board 700, with latches 740 being disposed at the opposite ends of each socket 730. Latches 740 facilitate securing (or removing) electronics cards 720 within (or from) the sockets.

FIGS. 8A-8D further depict multiple liquid-cooled cold rails 800, 810, 820, shown positioned at the ends of the elongate sockets 730 of the two arrays 721, 722 of electronics cards 720. Advantageously, these liquid-cooled cold rails are configured and positioned to not interfere with opening and closing of latches 740. The multiple cold rails include a first liquid-cooled cold rail 800, disposed at one end of sockets 730 in the first array 722 of electronics cards 720, a second liquid-cooled cold rail 810 disposed between the two arrays 722, 723 of electronics cards 720, and a third liquid-cooled cold rail 820 disposed at the other end of sockets 730 of the second array 723 of electronics cards 720. Holes 830 are provided within each of the cold rails. In one embodiment, these holes may comprise threaded holes in the cold rails which facilitate attachment of the thermal spreaders (not shown) to the respective cold rails, as described further below.

In FIG. 8B, first liquid-cooled cold rail 800 is illustrated in greater detail at the one end of the sockets 730 of the first array 722 of electronics cards 720. As noted above, each cold rail is a thermally conductive structure with at least one coolant-carrying channel extending therein. In this example, the coolant-carrying channel is a flattened tube 801 that is vertically-oriented within the cold rail and offset from holes 830. As shown, first liquid-cooled cold rail 800 is sized (in this example) to fit between sockets 730, and one or more fan sockets 805. In addition, the cold rail may be selectively recessed at its bottom surface and/or one or more side surfaces to clear any interfering components, such as capacitors or chips, on the printed circuit board. The flattened tube 801 extending through the thermally conductive structure of the cold rail may comprise (as one example) a flattened ⅛ inch pipe, which may be routed above any intrusive elements on the board. In the example illustrated, quick disconnects 802 are shown provided at the ends of flattened tube 801.

In FIG. 8C, second liquid-cooled cold rail 810 is illustrated in greater detail. This cold rail is configured and sized to fit between the two arrays 722, 723 of electronics cards. Two rows of holes 830 are provided within second liquid-cooled cold rail 810 to facilitate coupling of thermal spreaders from the different arrays to the cold rail. In order to clear the holes in the cold rail, a vertically-oriented, flattened pipe 811 passing through cold rail 810 is positioned within a slot 813 cut in the middle of the cold rail, for example, from the lower surface of the cold rail into the thermally conductive structure. By way of example, flattened tube 811 may be a flattened ⅛ inch pipe. Quick disconnect couplings 812 may also be provided for connecting flattened tube 811 in fluid communication with other coolant-carrying tubes, such as the bridging tubes described above in connection with FIG. 6.

FIG. 8D illustrates in greater detail one embodiment of third liquid-cooled cold rail 820 disposed at the other end of the second array 723 of electronics cards 720. As illustrated, third liquid-cooled cold rail 820 is positioned to not interfere with opening or closing of latches 730 at the other end of sockets 720 in the second array 723. The cold rail includes a series of holes 830, which will facilitate coupling thermal spreaders (not shown) to the cold rail, and accommodates a flattened tube 821, which is vertically aligned within an appropriately-sized slot 823 in the thermally conductive structure of the cold rail and is offset from the series of holes 830. This cold rail may again be selectively recessed at its lower surface and/or side surfaces to clear any interfering components on printed circuit board 700.

Figure 8A:
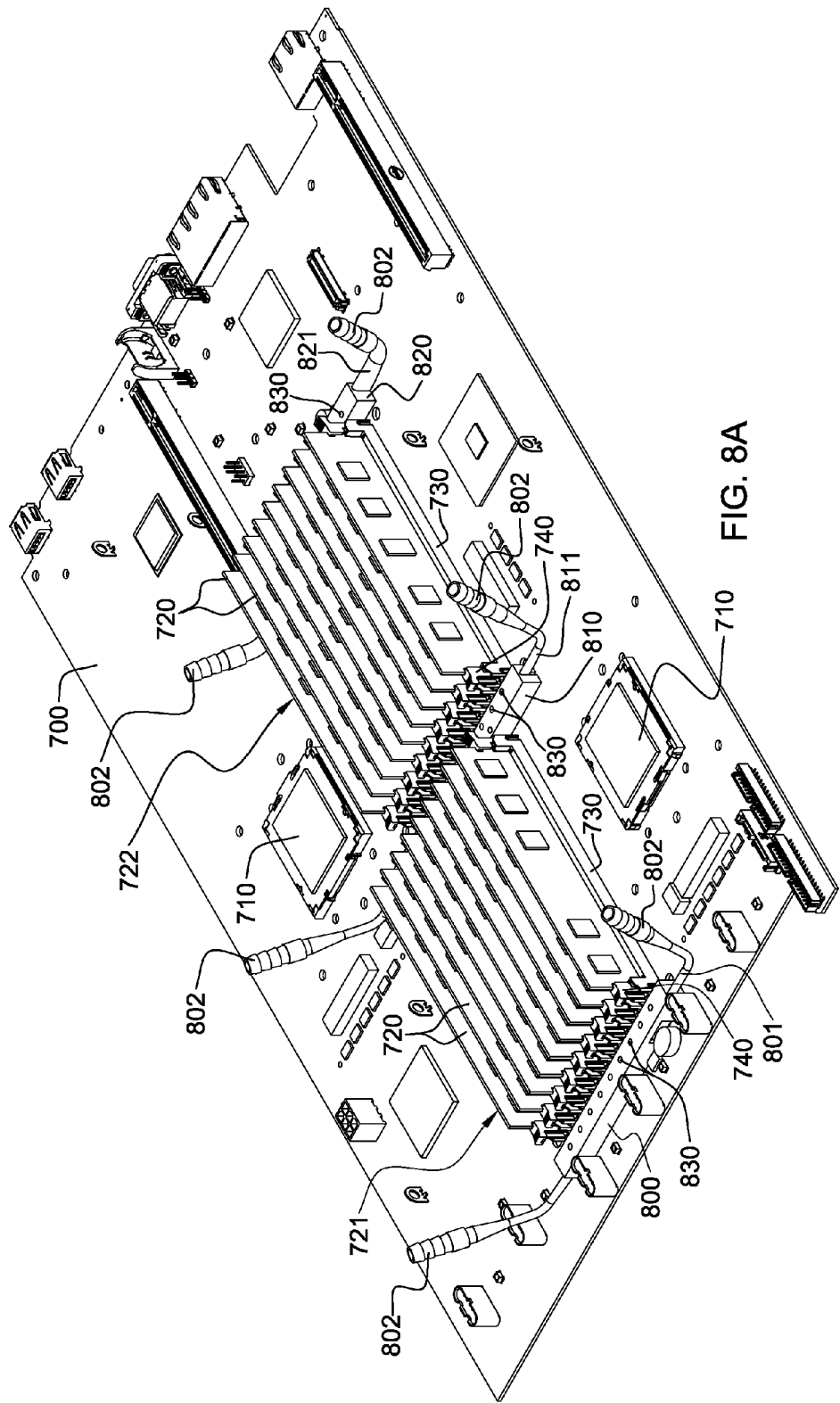
FIG. 8A depicts the electronic system of FIG. 7, with first, second and third liquid-cooled cold rails of a cooling apparatus shown in place at the ends of first and second arrays of sockets and electronics cards of the electronic system, in accordance with one or more aspects of the present invention.
Figure 9A:
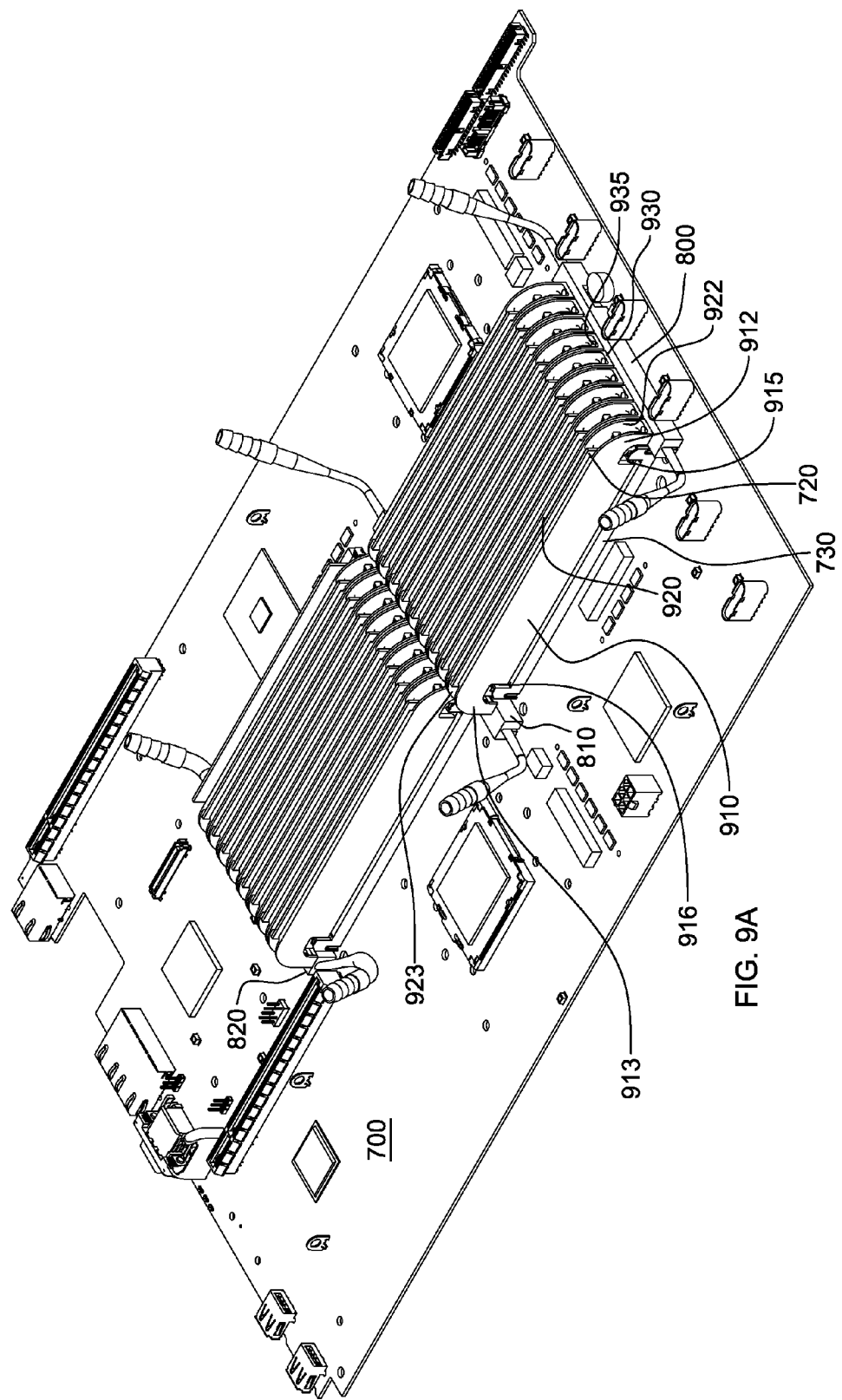
FIG. 9A depicts the partially assembled, cooled electronic system of FIGS. 8A-8D, with a plurality of thermal spreaders shown coupled to the electronics cards and thermally interfacing the electronics cards to respective liquid-cooled cold rails, in accordance with one or more aspects of the present invention.

In the example of FIG. 8D, and assuming the cooling implementation depicted in FIG. 6, the tube through which water flows may be a flattened, ¼ inch pipe, routed away from any intrusive elements on the printed circuit board. As illustrated in FIG. 8A, quick disconnect couplings 822 may be provided at the ends of flattened tube 820 to facilitate coupling of the tube in fluid communication with other tubes of the liquid-based cooling approach discussed above in connection with FIG. 6. As illustrated in FIGS. 8A-8D, each liquid-cooled cold rail 800, 810, 820 may be unique in terms of its location on the circuit board, and uniquely configured due to existing constraints within the different areas of the printed circuit board. These liquid-cooled cold rails are, in one embodiment, coupled to either a cold liquid cooling loop or a warm-liquid cooling loop, depending on the cooling approach desired, as described above.

FIGS. 9A-9D depict one embodiment of a cooled electronic system comprising the electronic subassembly of FIGS. 8A-8D, with a plurality of thermal spreaders shown positioned between and in physical and thermal contact with the electronics cards of the arrays (or banks) of electronics cards. These thermal spreaders provide a thermal coupling or thermal conduction path from the electronics cards, for example, the memory modules on the opposite sides of the electronics cards, to the liquid-cooled cold rails to facilitate cooling of the electronics cards via conductive heat transfer to the cold rails, and hence to the liquid flowing through the cold rails.

In the embodiment illustrated, each thermal spreader comprises a first thermal transfer plate 910 and a second thermal transfer plate 920. The first thermal transfer plate comprises a first thermal conduction surface 911, and the second thermal transfer plate 920 comprises a second thermal conduction surface 921. The first thermal conduction surface 911 and the second thermal conduction surface 921 are in spaced, opposing relation, and are configured to accommodate a respective electronics card 720 therebetween, with the first thermal conduction surface 911 physically and thermally coupled to at least one first surface on one side of the electronics card 720, and the second thermal conduction surface 922 physically and thermally coupled to at least one second surface on the other side of the electronics card 720. These first and second surfaces on the different sides of the electronics card may comprise, in one example, surfaces of one or more electronics devices, such as memory modules, mounted on the different sides of the respective electronics card.

Further, the first thermal transfer plate 910 and second thermal transfer plate 920 each comprise a first end edge 915, and a second end edge 916, disposed at opposite ends of the respective socket 730. Each thermal transfer plate is a thermally conductive structure formed (in one example) as an elongate, flat plate. In this example, thermally conductive extensions 912, 922 and 913, 923 are provided extending from the first and second end edges 915, 916 of each thermal transfer plate 910, 920.

In one embodiment, these extensions 912, 922 and 913, 923 are curved extensions, which may be characterized, in one embodiment, as "elephant trunk-shaped extensions". In particular, a first thermally conductive extension 912 is a curved extension which extends from and upper portion of first thermal transfer plate 910 at the first end edge thereof 915, and a similar, second thermally conductive extension 922 extends from the first end edge 915 of second thermal transfer plate 920. In addition, a third thermally conductive extension 913 extends from the second end edge 916 of first thermal transfer plate 910, and a fourth thermally conductive extension 923 extends from the second end edge 916 of second thermal transfer plate 920. The thermally conductive extensions 912, 922 at the first end edge 915 of the first and second thermal transfer plates 910, 920 are spaced apart to allow access to the respective socket latch 730 at the end of the socket containing the electronics card 720 sandwiched by the plates of the thermal spreader. Similarly, the thermally conductive extensions 913, 923 at the second end edges 916 of the first and second thermal transfer plates 910, 920 are spaced apart to allow access to the latch disposed at the other end of the socket. In this embodiment, the extensions 912, 922 and 913, 923 are joined at their ends, and connected to the respective cold rail by respective connecting flanges 930, each of which includes an opening 935, aligned to an underlying opening 830 in the adjacent cold rail 800, 810, 820. FIGS. 9B-9D illustrate these structures in greater detail, with the thermal spreaders 900 shown ready to be fastened to the respective cold rails using, for example, a threaded fastener.

As explained above, heat is transferred from the heat-generating components of the electronics card (for example, memory modules) to the conduction surfaces of the thermal transfer plates, across the thermal transfer plates to the thermally conductive extensions at the ends thereof, and from the thermally conductive extensions into the respective liquid-cooled cold rails. From the liquid-cooled cold rails, the heat is rejected to coolant flowing through the channels or tubes extending through the cold rails, and subsequently, is removed from the cooled electronic system in a manner such as, for example, explained above in connection with FIGS. 4-6.

Note that in the embodiment depicted in FIGS. 9A-9D, the connecting flanges 930 at the ends of the thermally conductive extensions (where contacting the respective cold rails), are solid connecting structures, meaning that the thermal spreaders are (in one embodiment) single-piece structures. Also, note that, in the approach depicted, heat is conducted by the thermal transfer plates to each end edge of the plates, and in particular, to the thermally conductive extensions extending from the respective end edges to the two cold rails disposed at the opposite ends of the respective sockets in an array (or bank) of electronics cards. These thermally conductive extensions and connecting flanges physically and thermally couple to the upper surface of the respective cold rails. As illustrated in the plan views of FIGS. 9B-9D, the latches for the respective sockets remain accessible by appropriately spacing each pair of thermally conductive extensions to the first and second sides of the latches at issue. This can be accomplished, in part, by reducing the thickness of the extensions compared with the thickness of the plates, as shown in the plan views of FIGS. 9B-9D.

FIGS. 10-17 depict further cooling apparatus embodiments, which build upon the liquid-cooling approaches described above, and particularly, the warm-liquid cooling approach described above with reference to FIGS. 4-9D.

Standard, high-volume industry server systems typically contain devices that include processors, memory, ASICs on the main board, I/O cards and disk drives. A typical 1U/2U dual socket server that contains a dual CPU socket, with dense memory configurations, might have 18-24 memory modules, 2-4 I/O cards, and 8-12 disk drives. Direct liquid-cooling solutions such as described above allow for cold plate or cold rail-based cooling solutions that enable heat extraction from the processors, memory, ASICs, memory, power supplies and I/O cards. These node-level solutions might enable 85%-95% heat extraction from the server. Cooling of disk drives for the servers in these designs would still require air-cooling devices, such as fans or blowers. Although the heat load of the disk drives might be a small fraction of the total heat load (e.g., <15% of the net heat load of a high-volume system), the need to air-cool such devices would still require the data center to be provided with an air-cooling capacity to manage the heat load rejected from the electronics racks containing those devices.

As described above, in one implementation, direct-server, liquid-cooling is accomplished using warm, inlet liquid temperatures in an operating range of 27° C.-45° C. The energy efficiency advantage of using such warm liquid cooling temperatures would be a primary motivation for implementing fully liquid-cooled high-volume servers. However, if components of the servers, such as the disk drives, were still to require air-cooling, then the data center will have to provide an additional chilled water loop to enable the air-cooling capacity required, even though the capacity may be low and limited, relative to the net data center heat load. Therefore, disclosed herein in connection with FIGS. 10-17 are enhanced liquid-based cooling apparatuses which eliminate any air-cooling requirement for the disk drives in (for example) a high-volume industry server implementation.

In accordance with the concepts described below, one or more warm-liquid coolant loops may be used to extract heat from substantially all components in an electronic system (e.g., server), including disk drives, while still enabling a capability to hot swap the disk drives.

Generally stated, the cooling apparatus disclosed herein facilitates dissipation of heat from an electronic component of an electronic system. In one example, the electronic component is a disk drive (such as a solid state disk drive or a rotating disk drive), and the electronic system is a server unit within an electronics rack comprising a plurality of server units. The cooling apparatus includes a liquid-cooled structure, such as a disk drive cold rail, which comprises a thermally conductive material with at least one coolant-carrying channel extending therein that facilitates the flow of coolant through the liquid-cooled structure. A coolant loop is coupled in fluid communication with the one or more coolant-carrying channels of the liquid-cooled structure, and facilitates heat transfer to an outdoor-air-cooled heat exchange unit. The outdoor-air-cooled heat exchange unit is coupled to facilitate heat transfer from the liquid-cooled structure to the heat exchange unit via, at least in part, the coolant loop. The heat exchange unit cools coolant passing through the coolant loop by dissipating heat from the coolant to outdoor ambient air. In one implementation, temperature of coolant entering the liquid-cooled structure from the coolant loop is assumed to be greater than temperature of outdoor ambient air to which the heat is dissipated. In such a warm, liquid-cooling approach, temperature of coolant entering the liquid-cooled structure might typically be in a range of 27° C. to 45° C. A thermal conduction path couples the electronic component and the liquid-cooled structure for facilitating transfer of heat from the electronic component to the liquid-cooled structure. This thermal conduction path comprises a thermoelectric array, which includes at least one thermoelectric module. The thermoelectric array facilitates controllable transfer of heat from the electronic component to the liquid-cooled structure, and is particularly advantageous in a warm, liquid-cooling approach, in order to drive greater heat transfer from the electronic component (e.g., disk drive) to the liquid-cooled structure.

The cooling approaches described hereinbelow utilize one or more thermoelectric-cooling (TEC) devices connected in a thermoelectric array that is provided, as part of the thermal conduction path between the electronic component (e.g., disk drive) and the liquid-cooled structure (e.g., disk drive cold rail). The thermoelectric array is controllable, which provides a means for establishing and controlling a temperature gradient across the array, for example, by applying a controllable amount of power to the array for pumping heat from a cold side to a hot side of the thermoelectric array, as described further below. The heat flux from an individual electronic component (such as a disk drive) might be small, for example, in the range of 3-4 Watts for drives available today, with a capability of increasing power consumption of up to, for example, 10 Watts over time. For standard server units available today, then the net heat capacity of the disk drives might be in the range of 50 Watts-120 Watts.

The thermoelectric arrays have a COP that could require additional heat dissipation in the range of about 100 Watts-200 Watts. The power of the TEC is supplied by a controller that monitors (for example) the cold side temperature and maintains a minimum temperature no lower than a value driven by, for example, room dew point temperature (which typically would be around 18° C. for a ASHRAE Class 2 data center). If the disk drive heat load is low, for example, because I/O rates being driven within the electronic systems or server are low, then the thermoelectric arrays might be maintained at a low temperature differential across the hot and cold sides. In the various cooling approaches described below, the thermoelectric arrays are placed in respective thermal conduction paths between an electronic component and the liquid-cooled structure, with the cold side of the array being closer to the electronic component (for example, mounted to a side surface of the electronic component (in one embodiment)). In a specific example, the thermoelectric array is attached to the mounting rail carrier of a disk drive along the side of the disk drive, and the hot side of the thermoelectric array transmits heat directly to the liquid-cooled structure (or via a thermal spreader, such as a heat pipe). As noted, in one embodiment, the liquid-cooled structure is part of a warm, liquid-cooling approach such as described above.

Figure 10:
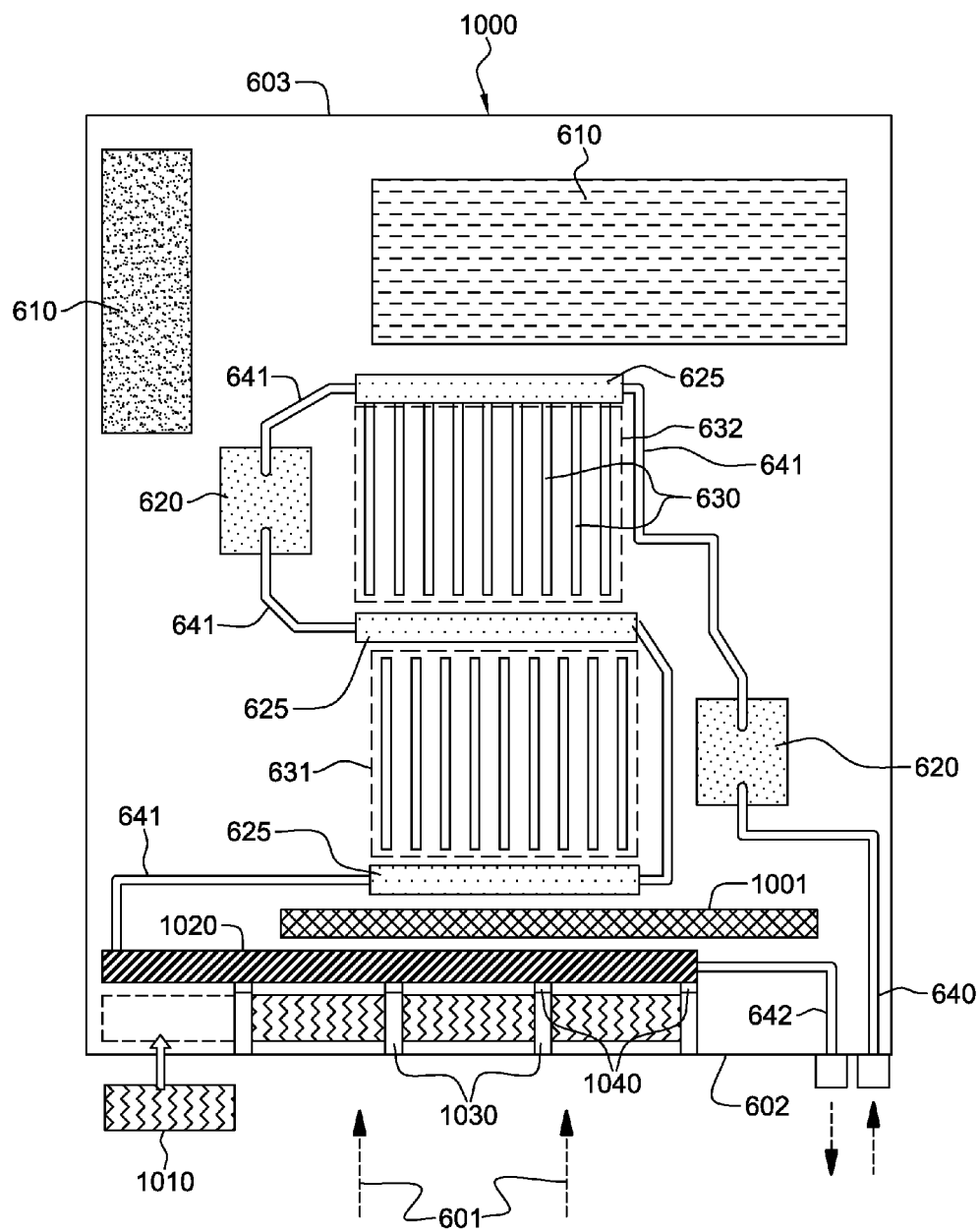
FIG. 10 is a plan view of an alternate embodiment of electronic system layout for a liquid-cooled electronics rack, and illustrating, in part, a cooling apparatus comprising multiple liquid-cooled structures coupled in fluid communication, in accordance with one or more aspects of the present invention.

Referring to FIG. 10, one embodiment of a cooled electronic system 1000 component layout (such as a server unit layout) is illustrated, wherein a smaller bank of one or more air-moving devices 1001 is used to provide a smaller amount of forced airflow 601 to cool any components 610 within electronic system 1000 not coupled for liquid-cooling (as described herein). Cool air is taken in through front 602 and exhausted out back 603 of cooled electronic system 1000. The multiple components to be cooled include, for example, multiple processor modules to which liquid-cooled cold plates 620 (of the liquid-based cooling apparatus) are coupled, as well as multiple arrays 631, 632 of electronics cards 630 (e.g., memory modules, such as dual in-line memory modules (DIMMs)), which are coupled to one or more liquid-cooled cold rails 625, as described above.

The illustrated liquid-based cooling approach further includes multiple coolant-carrying tubes connecting in fluid communication liquid-cooled cold plates 620 and liquid-cooled cold rails 625. These coolant-carrying tubes comprise (for example) a coolant supply tube 640, multiple bridge tubes 641, and a coolant return tube 642. In the embodiment illustrated, bridge tubes 641 connect one liquid-cooled cold rail 625 in series between the two liquid-cooled cold rails 620, and connect in series the two additional liquid-cooled cold rails 625 between the second liquid-cooled cold rail 620 and a liquid-cooled structure or cold rail 1020 for cooling the disk drives. Liquid-cooled structure 1020 is shown also connected in fluid communication with coolant return tube 642. Note that this configuration is provided by way of example only. The concepts disclosed herein may be readily adapted to use with various configurations of cooled electronic system layouts. Note also, that as depicted herein, the liquid-cooled cold rails are elongate, thermally conductive structures comprising one or more channels through which liquid coolant passes, for example, via one or more tubes extending through the structures. The liquid-cooled cold rails 625 are disposed, in the illustrated embodiment, at the ends of the two arrays 631, 632 of the electronics card 630, and multiple thermal spreaders are provided, coupling in thermal communication electronics cards 630 and the liquid-cooled cold rails 635, as described above. Liquid-cooled structure 1020, in the illustrated embodiment, is disposed near front 602 of cooled electronic system 1000 behind docking stations for a row of removable electronic components 1010, such as a row of removable disk drives.

FIG. 10 further illustrates that thermal spreaders 1030 are disposed between adjacent electronic components 1010 to couple to the sides of the components when the components are operatively positioned within the electronic system as illustrated. These thermal spreaders conduct heat from the sides of the electronic components 1010 to the liquid-cooled structure 1020 across a respective thermoelectric array 1040 disposed within the thermal conduction path between the electronic component and the liquid-cooled structure. Note that in the embodiments described herein, the electronic components 1010 are secondary heat-generating components which may be operatively inserted within or removed from the electronic system without requiring interruption in flow of liquid coolant through the electronic system. Thermal conduction from the sides of electronic components 1010 to thermal spreaders 1030 can be facilitated by providing a thermal grease, thermally conductive pad, or other interstitial thermally conductive layer, between the side of the component and the thermal spreader, to ensure that the electronic component and the thermal spreader are thermally interfaced with a good thermal conduction path between the component and the spreader.

Figure 11:
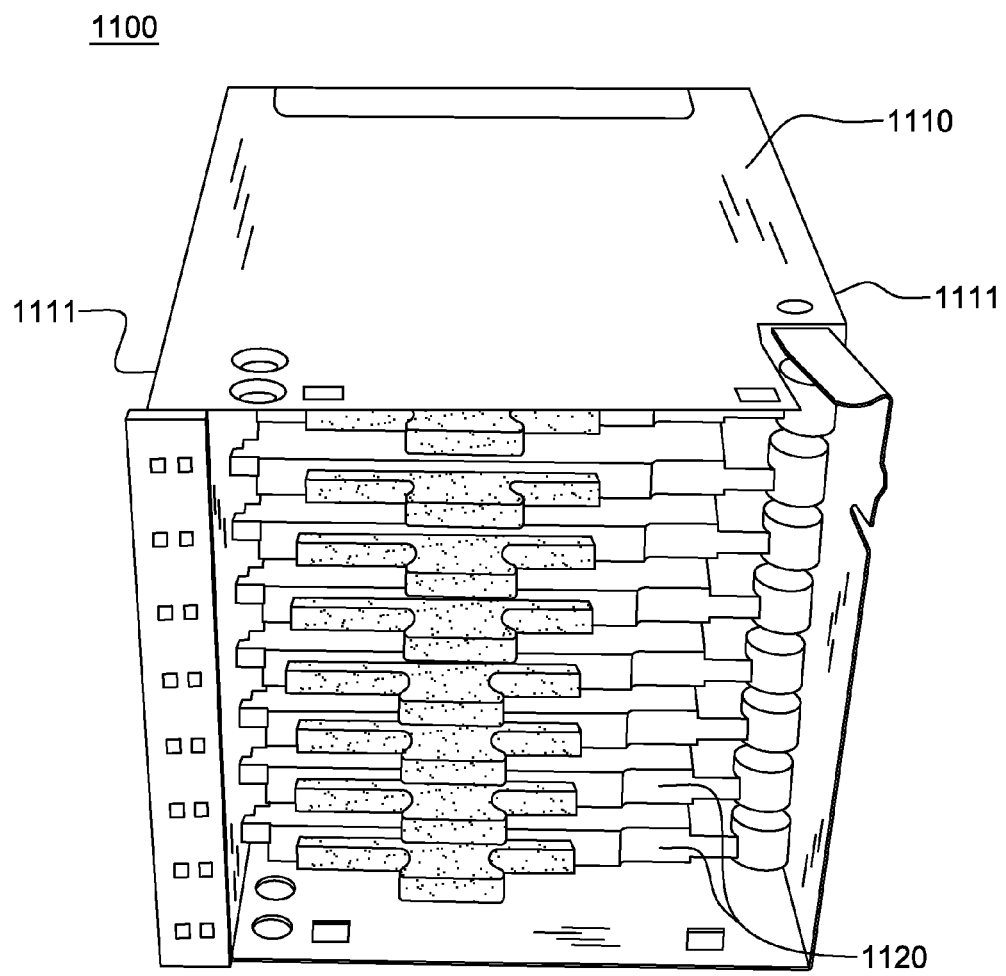
FIG. 11 is an isometric view of one embodiment of a secondary heat-generating component (comprising a data storage device), such as illustrated in the electronic system layout of FIG. 10, in accordance with one or more aspects of the present invention.

FIG. 11 is an isometric view of one embodiment of electronic component 1010 of FIG. 10. In FIG. 11, the component is illustrated to be a disk drive 1100, and more particularly, a solid state drive (SSD), which comprises an SSD cage 1110 containing a plurality of SSD carriers 1120. In accordance with one embodiment of the present invention, the cooling apparatus comprises one or more thermal conduction paths coupled to one or both side surfaces 1111 of SSD cage 1110. One embodiment of such a thermal conduction path is illustrated in FIG. 12A.

Figure 12A:
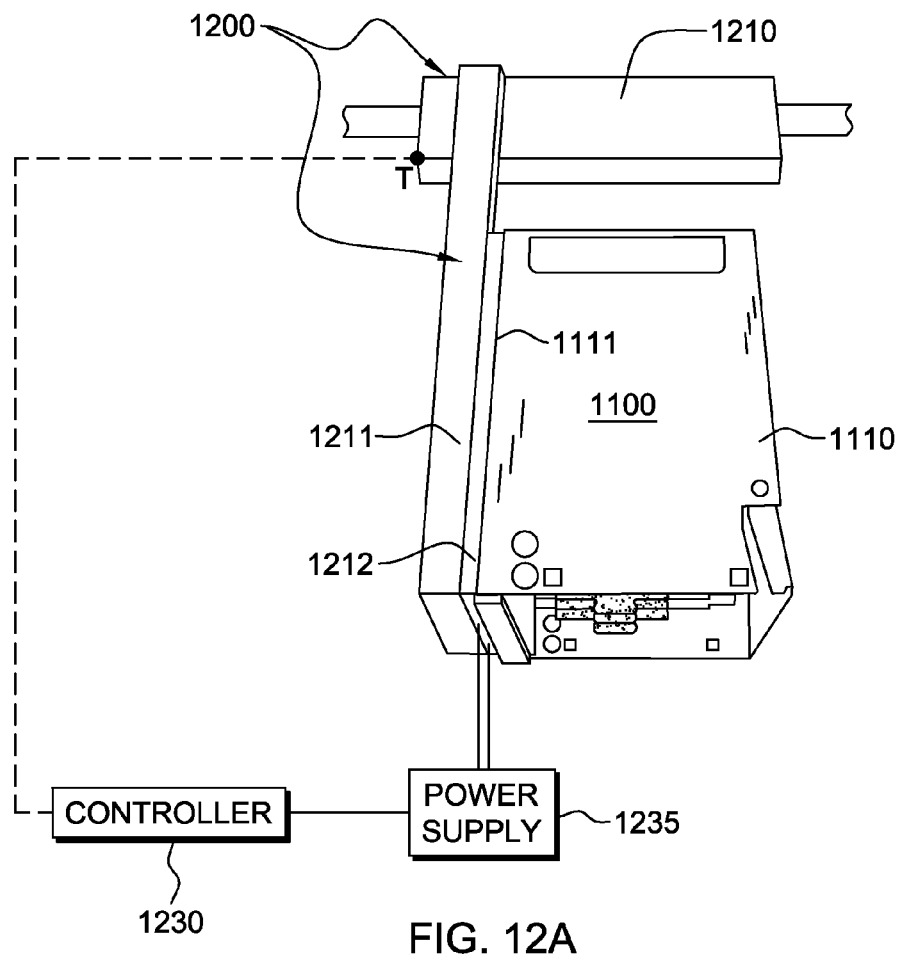
FIG. 12A illustrates a partial embodiment of a cooled electronic system comprising a cooling apparatus and the secondary heat-generating component illustrated in FIG. 11, in accordance with one or more aspects of the present invention.

More particularly, FIG. 12A illustrates one embodiment of a cooling apparatus, generally denoted 1200, comprising a liquid-cooled structure 1210, and a thermal conduction path, which comprises a thermal spreader 1211, and a thermoelectric array 1212. In specific embodiments, thermal spreader 1211 may be a solid, thermally conductive plate, or itself comprise one or more heat pipes. For example, multiple cylindrical-shaped heat pipes may be embedded within thermal spreader 1211. As is known, a heat pipe may comprise a hollow structure that allows heat to migrate from one end of the structure to another end via a flow of vapor, and provides a return of liquid condensate under the action of capillary force via a wick or screen-like matrix. A high concentration of vapor may exist closer to the heat source with a lower concentration of vapor at the condenser end of the heat pipe. The result is a mass flow from one end to the other end of the member, taking advantage of the latent thermal capacity of the vapor to carry heat from one end to the other. In one implementation, a thermal spreader with multiple heat pipes may be fabricated by drilling appropriately sized holes in a block of thermally conductive material, such as copper or aluminum, after which cylindrical-shaped heat pipes may be inserted. Note, however, that various other thermal spreader configurations, either with or without heat pipes, may be employed.

In the embodiment of FIG. 12A, thermoelectric array 1212 couples to a side surface 1111 of electronic component 1100, such as the side surface of the SSD cage 1110 comprising the multiple SSD carriers. The thermoelectric array 1212 is a controllable thermoelectric array disposed within the thermal conduction path between electronic component 1100 and liquid-cooled structure 1110. This thermoelectric array is configured and positioned to pump heat from the electronic component down the thermal conduction path to the liquid-cooled structure, and hence to coolant flowing through the liquid-cooled structure for rejection from the electronic system (or electronics rack) comprising the electronic component. The use of thermoelectric elements to electronically transfer heat is known in the art, as represented by U.S. Pat. No. 6,557,354 B1, wherein the use of thermoelectric elements to facilitate the transfer of heat from, for example, a coolant (such as a water stream) to a warmer air stream is described.

Figure 12B:
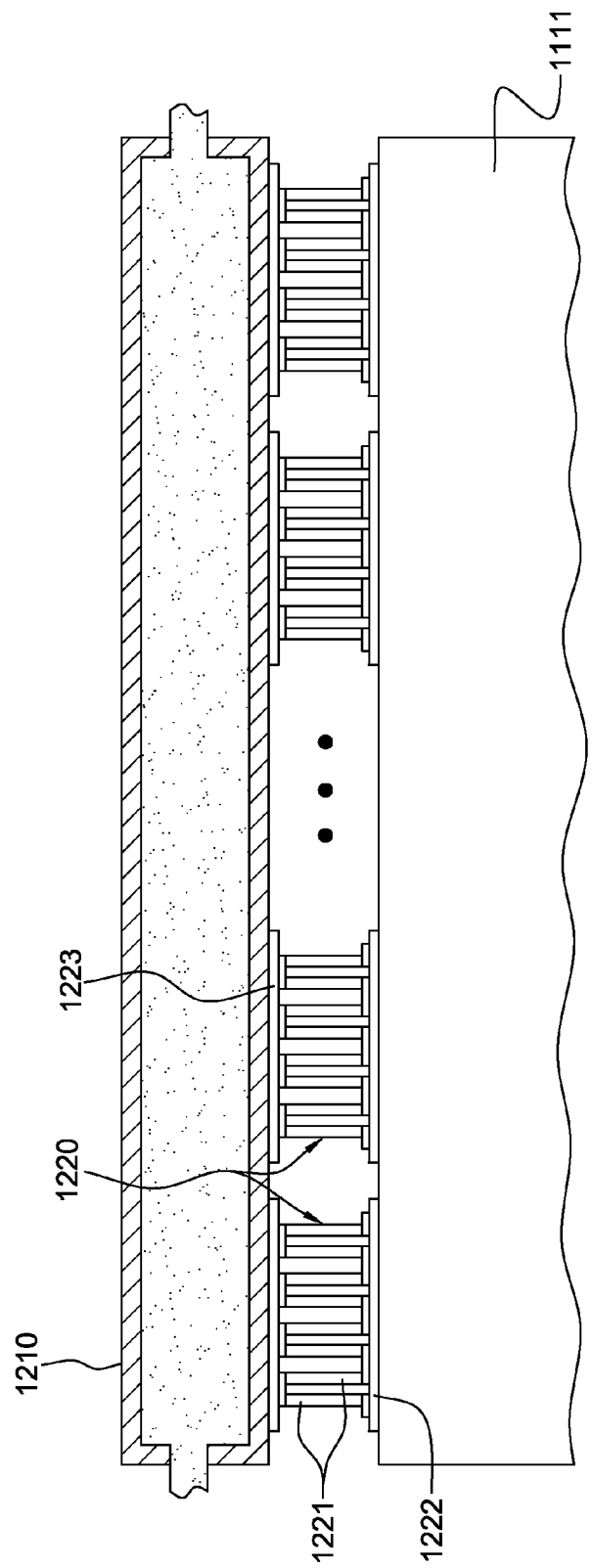
FIG. 12B is a partial, cross-sectional elevational view of one embodiment of a thermoelectric-enhanced, cooling apparatus facilitating transfer of heat from an electronic component to a liquid-cooled structure, in accordance with one or more aspects of the present invention.

FIG. 12B is a cross-sectional elevational view of one embodiment of a thermoelectric-enhanced transfer of heat from a surface of an electronic component, such as a side surface 1111 of SSD cage 1100 of FIG. 12A, to a liquid-cooled structure 1210, which (in this example) is directly coupled to a hot side 1223 of the thermoelectric array. The thermoelectric array comprises a plurality of thermoelectric modules 1220, each of which comprises individual thermoelectric elements 1221. In this example, the cold side 1222 of the thermoelectric array is coupled to the surface of the electronic component to be cooled, and the hot side 1223 of the thermoelectric array is coupled to the liquid-cooled structure 1210.

The use of multiple thermoelectric cooling elements within a module is known. These elements operate electronically to produce a cooling effect. By passing a direct current through the elements of a thermoelectric device, a heat flow is produced across the device which may be contrary to that which would be expected from Fourier's law.

At one junction of the thermoelectric element, both holes and electrons move away, towards the other junction, as a consequence of the current flow through the junction. Holes move through the p-type material and electrons through the n-type material. To compensate for this loss of charge carriers, additional electrons are raised from the valence band to the conduction band to create new pairs of electrons and holes. Since energy is required to do this, heat is absorbed at this junction. Conversely, as an electron drops into a hole at the other junction, its surplus energy is released in the form of heat. This transfer of thermal energy from the cold junction to the hot junction is known as the Peltier effect.

Use of the Peltier effect permits the surfaces attached to a heat source to be maintained at a temperature below that of a surface attached to a heat sink. What these thermoelectric modules provide is the ability to operate the cold side below the ambient temperature of the cooling medium (e.g., air or water). When direct current is passed through the thermoelectric modules, a temperature difference is produced with the result that one side is relatively cooler than the other side. These thermoelectric modules are therefore seen to possess a hot side and a cold side, and provide a mechanism for facilitating the transfer of thermal energy from the cold side of the thermoelectric module to the hot side of the thermoelectric module.

By way of specific example, thermoelectric modules 1220 may comprise TEC CP-2-127-06L modules, offered by Melcor Laird, of Cleveland, Ohio.

Note that the thermoelectric array may comprise any number of thermoelectric modules, including one or more modules, and is dependent (in part) on the size of the electronic modules, as well as the amount of heat to be transferred to coolant flowing through liquid-cooled structure 1210. Also note that an insulative material (not shown) may be provided over one or more of the exposed surfaces of the thermal conduction path or liquid-cooled structure.

The thermoelectric (TE) array may comprise a planar thermoelectric array with modules arranged in a square or rectangular array. Although the wiring is not shown, each thermoelectric module in a column may be wired and supplied electric current (I) in series and the columns of thermoelectric modules may be electrically wired in parallel so that the total current supplied would be I×sqrt(M) for a square array comprising M thermoelectric modules, providing an appreciation of the inherent scalability of the array. In this way, if a single thermoelectric module should fail, only one column is effected, and electric current to the remaining columns may be increased to compensate for the failure.

Table 1 provides an example of the scalability provided by a planar thermoelectric heat exchanger configuration such as described herein.

TABLE 1

| Number of TE Modules (M) | Array Size |
| --- | --- |
| 81 | 585 mm × 585 mm |
|  | (23.0 in. × 23.0 in.) |
| 100 | 650 mm × 650 mm |
|  | (25.6 in. × 25.6 in.) |
| 121 | 715 mm × 715 mm |
|  | (28.2 in. × 28.2 in.) |
| 144 | 780 mm × 780 mm |
|  | (30.7 in. × 30.7 in.) |
| 169 | 845 mm × 845 mm |
|  | (33.3 in. × 33.3 in.) |

For a fixed electric current and temperature difference across the thermoelectric modules, the heat pumped by the thermoelectric array will scale with the number of thermoelectric modules in the planform area. Thus, the heat load capability of a 650 mm×650 mm thermoelectric heat exchanger will be 1.23 times that of a 585 mm×585 mm thermoelectric heat exchanger, and that of an 845 mm×845 mm will be 2.09 times greater. If the space available for the thermoelectric heat exchanger is constrained in the X×Y dimensions, then the heat pumping capabilities can still be scaled upwards by growing in the Z dimension. This can be done by utilizing multiple layers of thermoelectric modules between multiple heat exchange elements, with alternating hot and cold sides, as described in the above-referenced U.S. Pat. No. 6,557,354 B1.

Continuing with FIG. 12A, a controller 1230 is provided coupled in communication with one or more temperature sensors (T), disposed to sense a temperature associated with cooling of the electronic component. By way of example, this temperature might comprise a temperature of the liquid-cooled structure 1210, or of coolant flowing through the liquid-cooled structure, or a temperature of a surface of the electronic component or the thermoelectric array. Using this information, controller 1230 controls the electric current supplied by a DC power supply 1235 to thermoelectric array 1212.

Figure 12C:
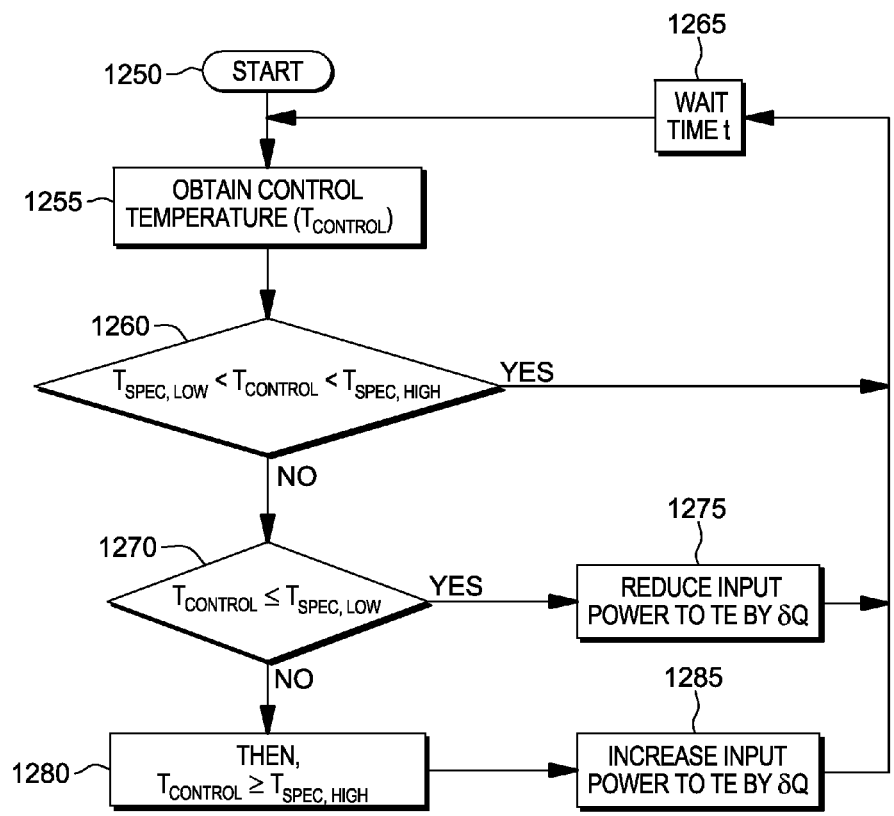
FIG. 12C depicts one embodiment of a control process for the thermoelectric-enhanced, cooling apparatus of FIG. 12A, in accordance with one or more aspects of the present invention.

FIG. 12C depicts, by way of example, one embodiment of a control process which may be employed in connection with cooling the disk drives in the thermoelectric-enhanced, liquid-cooling approach of FIGS. 10-12B. The control process of FIG. 12C begins 1250 with obtaining one or more control temperature readings ($T_{control}$) 1255. As noted, the control temperature(s) might comprise, for example, a surface temperature of the electronic component, a surface temperature of the thermoelectric array, a surface temperature of the liquid-cooled structure, a temperature of coolant flowing through the liquid-cooled cold rail, or a temperature of coolant at the inlet to the electronic system, etc. Using this information, the amount of power applied to the thermoelectric array can be incrementally adjusted to achieve a desired amount of cooling. Processing determines whether temperature $T_{control}$ is between a specified acceptable low temperature ($T_{spec,low}$) and a specified high temperature ($T_{spec,high}$) 1260. If "yes", then processing waits a time t 1265 before repeating the process by obtaining the then-current control temperature(s). If the obtained control temperature is outside of the specified high and low temperature range, then processing determines whether the control temperature ($T_{control}$) is less than or equal to the specified low temperature ($T_{spec,low}$) 1270, and if so, reduces the input power to the thermoelectric (TE) array by a specified amount (δQ) 1275, before waiting time t 1265, and then repeating the process. If the control temperature is greater than the specified low temperature ($T_{spec,low}$), then the control temperature is necessarily greater than or equal to the specified high temperature ($T_{spec,high}$) 1280, and power is increased to the thermoelectric array by (in one embodiment) the specified amount (δQ) 1285. After increasing the input power to the thermoelectric array to pump additional heat across the thermoelectric array, processing waits time t 1265 before repeating the process. In this manner, the amount of heat transported across the thermoelectric array from the electronic component to the liquid-cooled structure is, continually monitored, and if necessary, dynamically adjusted for, for example, optimum cooling of the associated electronic component(s) and/or enhanced energy efficiency.

FIGS. 13-16 depict various alternate embodiments for the cooling apparatus, and in particular, of the thermal conduction path coupling the electronic component and the liquid-cooled structure, in accordance with one or more aspects of the present invention.

Figure 13:
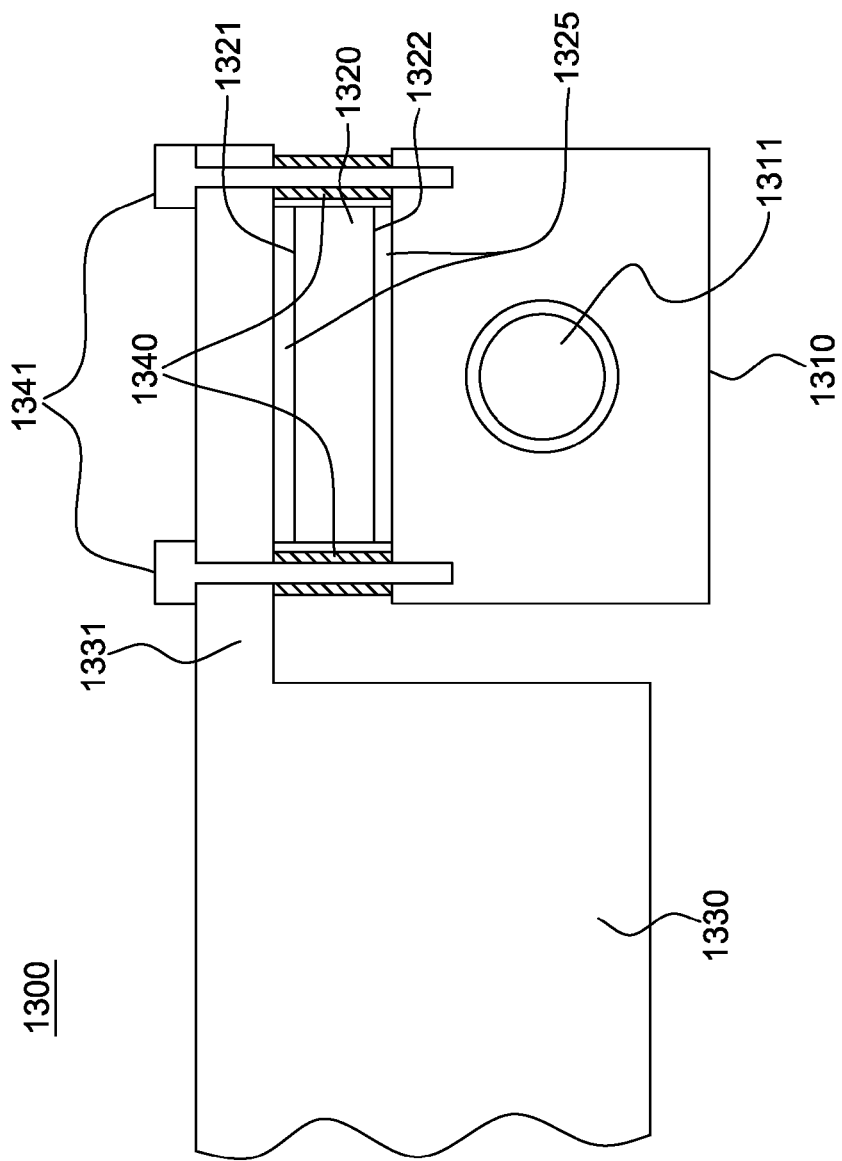
FIG. 13 depicts a partial elevational view of an alternate embodiment of a cooling apparatus for facilitating cooling of one or more secondary heat-generating components of an electronic system such as depicted in FIG. 10, in accordance with one or more aspects of the present invention.

Referring to FIG. 13, a partial embodiment of a cooling apparatus 1300 is illustrated, which comprises a liquid-cooled structure 1310, a coolant loop coupled in fluid communication with one or more coolant-carrying channels 1311 extending within liquid-cooled structure 1310, an outdoor-air-cooled heat exchange unit (such as described above in connection with FIG. 4), and a thermal conduction path comprising one or more thermoelectric arrays 1320, having (for example) one or more controllable thermoelectric modules, such as described above in connection with FIGS. 12A-12C. The thermal conduction path further includes (in this example) a thermal spreader 1330, which may comprise one or more heat pipes, if desired, for conducting heat from a surface of the electronic component towards thermoelectric array 1320. In this implementation, thermal spreader 1330 comprises a solid plate structure (such as a metal plate) physically coupled to at least one surface of at least one electronic component, for example, across a thermal interface material. In one embodiment, thermal spreader 1330 might extend between and provide a thermal conduction path from two adjacent electronic components, such as the above-described data storage devices of FIGS. 10-12C. In the illustrated embodiment, thermal spreader 1330 is configured with a thermally conductive extension 1331 which extends over liquid-cooled structure 1310, between which is located thermoelectric array 1320. Thermal interface material 1325 is provided between cold side 1321 of thermoelectric array 1320 and extension 1331 of thermal spreader 1330, and between hot side 1322 of thermoelectric array 1320 and, in this example, an upper surface of liquid-cooled structure 1310. Springs 1340 and attachment mechanisms 1341 are employed to physically attach thermally conductive extension 1331, thermoelectric array 1320 and liquid-cooled structure 1310, as illustrated. Springs 1340 ensure good physical and thermal coupling between the thermally conductive extension 1331, thermoelectric array 1320 and liquid-cooled structure 1310.

Figure 14:
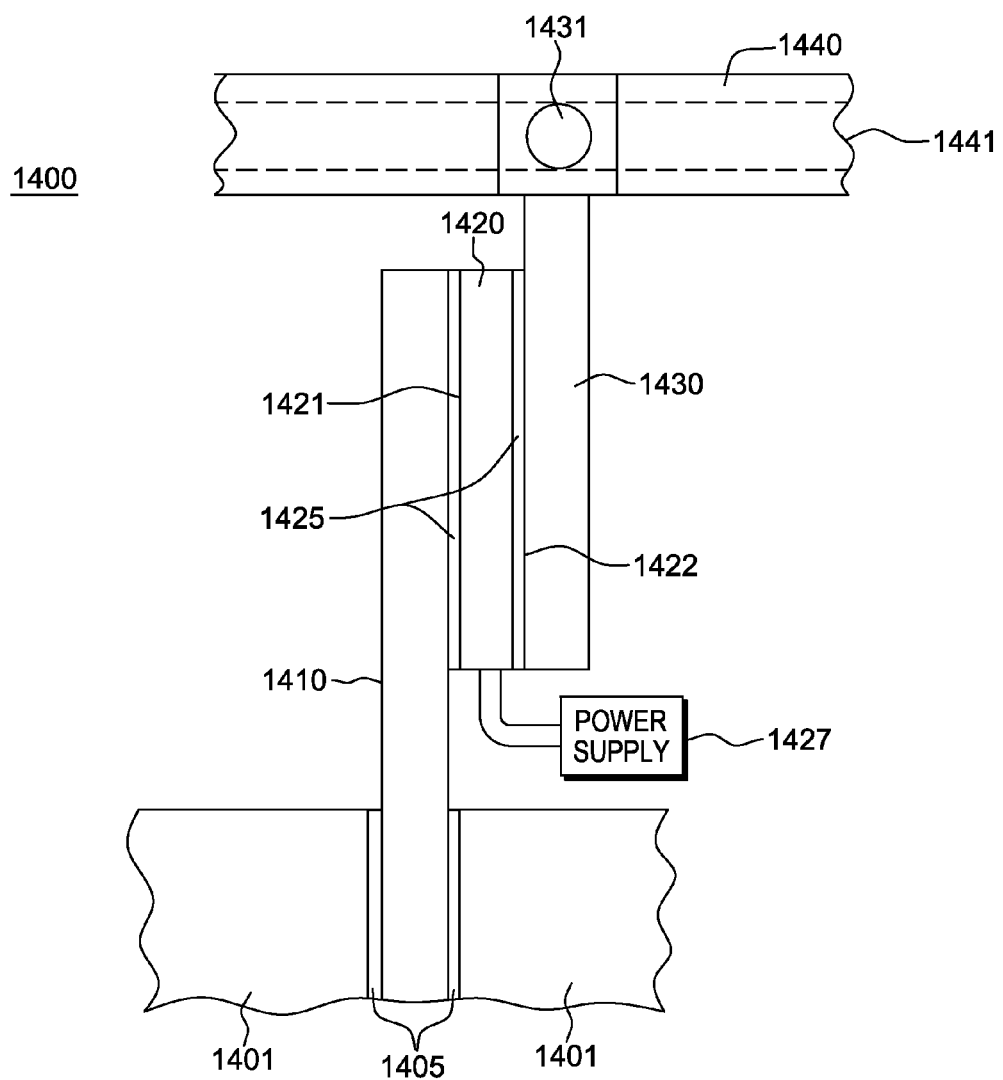
FIG. 14 is a partial plan view of another embodiment of a cooling apparatus for facilitating cooling of one or more secondary heat-generating components of an electronic system such as illustrated in FIG. 10, in accordance with one or more aspects of the present invention.

FIG. 14 is a top plan view of an alternate embodiment of a cooling apparatus 1400, facilitating dissipation of heat from one or more electronic components 1401 (such as the above-described disk drives) of an electronic system (see, for example, FIG. 10). Cooling apparatus 1400 includes a thermal conduction path comprising a first thermal spreader 1410, a thermoelectric array 1420, and a second thermal spreader 1430, which is coupled to a liquid-cooled cold rail 1440 (comprising one or more coolant-carrying channels 1441 extending therein). As illustrated, first thermal spreader 1410 resides between two adjacent electronic components, such as two adjacent disk drives in a row of disk drives of the electronic system. Thermal interface material 1405 is employed to thermally enhance heat conduction between, for example, the side surfaces of the two adjacent electronic components (e.g., side surfaces of two adjacent disk drive cages) and the first thermal spreader 1410. Thermal interface material 1405 is a temporary interface material since, as noted above, electronic component 1401 is to be removable, for example, hot swappable during operation of the electronic system. If desired, thermal spreader 1410 may comprise one or more heat pipes (not shown). The cold side 1421 of thermoelectric array 1420 is coupled via, for example, a permanent, higher-performance thermal interface material 1425 (such as an epoxy or solder), which may bond first thermal spreader 1410 to thermoelectric array 1420. Additionally, a permanent, higher-performance thermal interface material 1425 enhances heat conduction from the hot side 1422 of thermoelectric array 1420 to second thermal spreader 1430. Second thermal spreader 1430 is coupled at one end via an attachment mechanism 1431 (e.g., a bolt) to the liquid-cooled structure 1440. As with the embodiment described above in connection with FIG. 12A, a controller (not shown) and a controllable power supply 1427 are provided to controllably adjust the amount of heat being pumped from cold side 1421 to hot side 1422 of thermoelectric array 1420 based, for example, on one or more sensed control temperatures associated with cooling of electronic component(s) 1401.

Figure 15A:
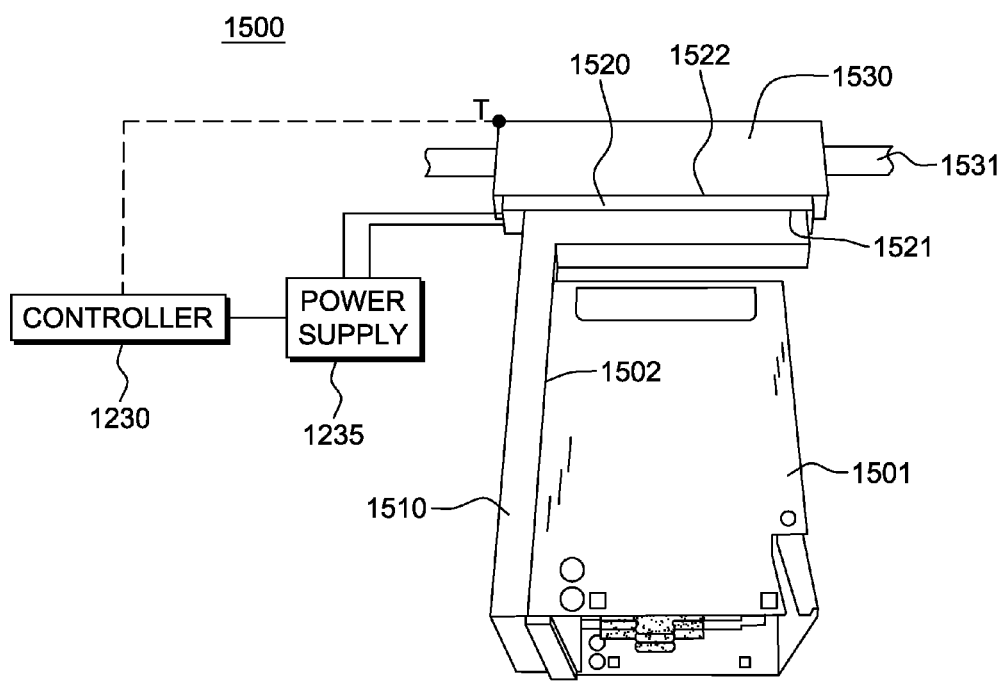
FIG. 15A depicts another alternate embodiment of a cooling apparatus for facilitating cooling of one or more secondary heat-generating components of an electronic system such as depicted in FIG. 10, in accordance with one or more aspects of the present invention.

FIG. 15A depicts another embodiment of a cooling apparatus 1500, such as described above in connection with FIGS. 10-14, wherein the thermal conduction path comprises in this embodiment an L-shaped thermal spreader 1510, which in one example may be an L-shaped heat pipe, that is physically coupled to a side surface 1502 of an electronic component 1501 to be cooled. In this example, electronic component 1501 may again comprise a cage or housing for one or more disk drives to be employed by the electronic system. A liquid-cooled structure or cold rail 1530 is coupled to L-shaped thermal spreader 1510 across a thermoelectric array 1520. The cold side 1521 of thermoelectric array 1520 is coupled to thermal spreader 1510, and the hot side 1522 is, in this example, attached to a surface of the liquid-cooled structure 1530. As explained above, liquid-cooled structure 1530 includes one or more coolant-carrying channels extending through the structure, such as a coolant-carrying tube 1531.

Figure 15B:
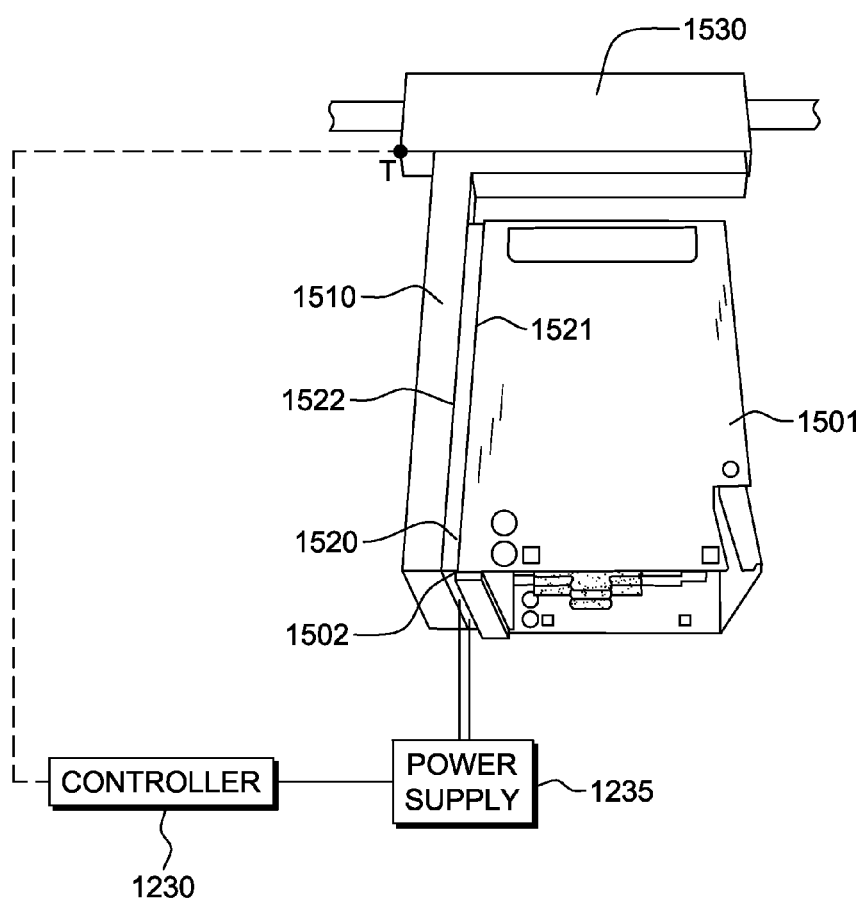
FIG. 15B depicts another alternate embodiment of a cooling apparatus for facilitating cooling of one or more secondary heat-generating components of an electronic system such as depicted in FIG. 10, in accordance with one or more aspects of the present invention.

In the example of FIG. 15B, the cooling apparatus 1500 of FIG. 15A is illustrated, with the thermoelectric array 1520 being repositioned between the side surface 1502 of electronic component 1501 and a surface of L-shaped thermal spreader 1510 (which, as noted, may comprise a heat pipe). In this example, L-shaped thermal spreader 1510 is in physical contact with a surface of liquid-cooled structure 1530, for example, by bolting of thermal spreader 1510 to a surface of liquid-cooled structure 1530. In this embodiment, the cold side 1521 of thermoelectric array 1520 is physically coupled (e.g., across a thermal interface material, such as a thermal grease) to surface 1502 of electronic component 1501 to be cooled, and the hot side 1522 is coupled (e.g., across a more permanent thermal interface material, such as an epoxy or solder) to a surface of L-shaped thermal spreader 1510.

Figure 16:
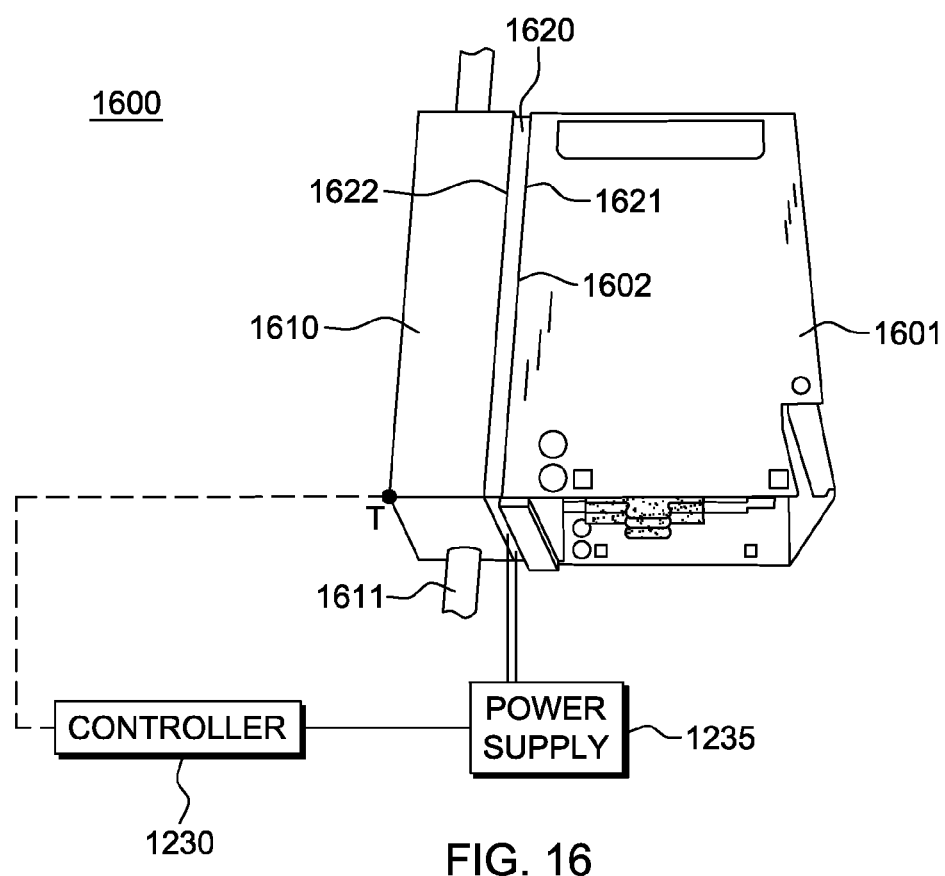
FIG. 16 depicts still another embodiment of a cooling apparatus for facilitating cooling of one or more secondary heat-generating components of an electronic system such as depicted in FIG. 10, in accordance with one or more aspects of the present invention.

In the example of FIG. 16, a cooling apparatus 1600 (such as described above in connection with FIGS. 10-12C) is illustrated, which includes a liquid-cooled structure 1610, comprising a thermally conductive material with at least one coolant-carrying channel 1611 extending therein. Liquid-cooled structure 1610 is coupled via a thermal conduction path to a surface 1602 of an electronic component 1601, such as a surface of a disk drive component of an electronic system, such as described above. In this example, the conduction path from the surface 1602 to be cooled to liquid-cooled structure 1610 includes a thermoelectric array 1620, with the cold side 1621 of thermoelectric array 1620 being coupled (e.g., across a thermal interface material) to surface 1602 of electronic component 1601, and the hot side 1622 of thermoelectric array 1620 being coupled (e.g., across a permanent thermal interface material) to liquid-cooled structure 1610. As in the embodiments described above, a coolant loop is coupled in fluid communication with the coolant-carrying channel extending through the liquid-cooled structure and, in one embodiment, an outdoor-air-cooled heat exchange unit is coupled to the liquid-cooled structure via, at least in part, the coolant loop, to facilitate cooling coolant passing through the coolant loop, and hence through the liquid-cooled structure, by dissipating heat from the coolant to outdoor ambient air. The thermoelectric array is (in one embodiment) controllable, as described above in connection with FIGS. 12A-12C, based (for example) on one or more sensed control temperatures associated with cooling of the electronic component.

Advantageously, disclosed hereinabove are various cooling apparatuses for facilitating cooling of secondary heat-generating components, such as disk drives, of an electronic system (e.g., server unit). These cooling apparatuses facilitate removing principally all heat from the electronic system via the liquid coolant, thereby minimizing the need for air-conditioning within the data center. The cooling apparatuses presented can be applied to both rotating media drives (HDD), as well as solid state drives (SSD). Advantageously, the secondary heat-generating component(s) can be removed or inserted without requiring interruption in coolant flow through the electronic system. For example, the cooling apparatus may couple to a drive cage of the disk drive (which comprise multiple drive trays, and drive support rails that the drive trays slide on for removal). Similar structures for the rotating media drive may also be present. Advantageously, the liquid-cooled structure and conductive thermal transfer to the liquid-cooled structure, are configured to allow for a thermoelectric array interface to be included in the thermal conduction path. By their nature, disk drives are surrounded by metal, which give a good conduction path from the disk drives to the drive cage, which is (in one embodiment) the structure being advantageously employed by the cooling apparatuses disclosed herein. In the embodiments disclosed, thermal conduction paths are provided with thermoelectric arrays, which enhance the fraction of heat load carried away by the coolant. This results in more energy-efficient systems at the data center level, since reduced (or no) air-conditioning may be required. This also results in lower-cost rack-cooling, since no air-to-liquid heat exchanger would be needed at the rack-level. Further, the cooling apparatuses presented herein utilize lower-cost and lower-performance conduction structures (such as cold rails), wherein the thermoelectric arrays yield refrigeration and compensate for the lower-performance cooling, and/or the warm liquid (sink) temperatures of the cooling apparatuses disclosed.

As will be appreciated by one skilled in the art, control aspects of the present invention may be embodied as a system, method or computer program product. Accordingly, control aspects of the present invention may take the form of an entirely hardware embodiment, an entirely software embodiment (including firmware, resident software, micro-code, etc.) or an embodiment combining software and hardware aspects that may all generally be referred to herein as a "circuit," "module" or "system". Furthermore, control aspects of the present invention may take the form of a computer program product embodied in one or more computer readable medium(s) having computer readable program code embodied thereon.

A computer readable storage medium may be, for example, but not limited to, an electronic, magnetic, optical, electromagnetic, infrared or semiconductor system, apparatus, or device, or any suitable combination of the foregoing. More specific examples (a non-exhaustive list) of the computer readable storage medium include the following: an electrical connection having one or more wires, a portable computer diskette, a hard disk, a random access memory (RAM), a read-only memory (ROM), an erasable programmable read-only memory (EPROM or Flash memory), an optical fiber, a portable compact disc read-only memory (CD-ROM), an optical storage device, a magnetic storage device, or any suitable combination of the foregoing. In the context of this document, a computer readable storage medium may be any tangible medium that can contain or store a program for use by or in connection with an instruction execution system, apparatus, or device.

Figure 17:
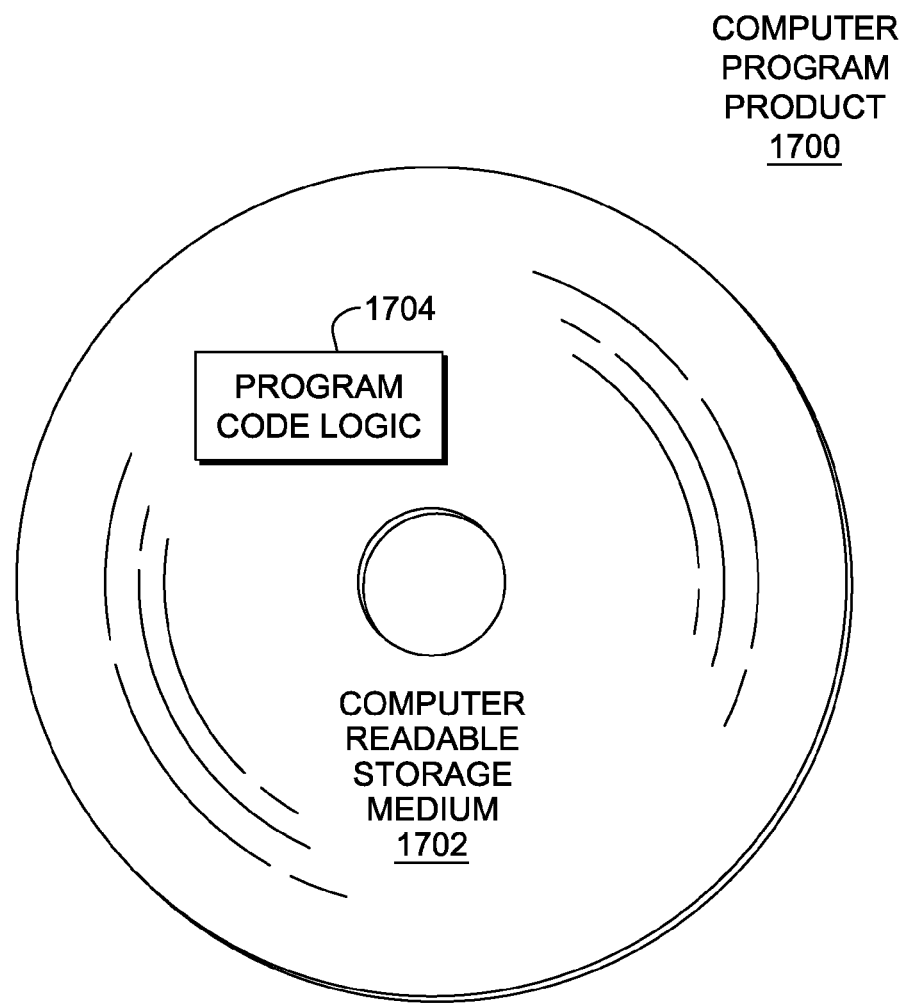
FIG. 17 depicts one embodiment of a computer program product incorporating one or more aspects of the present invention.

Referring now to FIG. 17, in one example, a computer program product 1700 includes, for instance, one or more computer readable storage media 1702 to store computer readable program code means or logic 1704 thereon to provide and facilitate one or more aspects of the present invention.

Program code embodied on a computer readable medium may be transmitted using an appropriate medium, including but not limited to wireless, wireline, optical fiber cable, RF, etc., or any suitable combination of the foregoing.

Computer program code for carrying out operations for aspects of the present invention may be written in any combination of one or more programming languages, including an object oriented programming language, such as Java, Smalltalk, C++ or the like, and conventional procedural programming languages, such as the "C" programming language, assembler or similar programming languages. The program code may execute entirely on the user's computer, partly on the user's computer, as a stand-alone software package, partly on the user's computer and partly on a remote computer or entirely on the remote computer or server. In the latter scenario, the remote computer may be connected to the user's computer through any type of network, including a local area network (LAN) or a wide area network (WAN), or the connection may be made to an external computer (for example, through the Internet using an Internet Service Provider).

Aspects of the present invention are described herein with reference to flowchart illustrations and/or block diagrams of methods, apparatus (systems) and computer program products according to embodiments of the invention. It will be understood that each block of the flowchart illustrations and/or block diagrams, and combinations of blocks in the flowchart illustrations and/or block diagrams, can be implemented by computer program instructions. These computer program instructions may be provided to a processor of a general purpose computer, special purpose computer, or other programmable data processing apparatus to produce a machine, such that the instructions, which execute via the processor of the computer or other programmable data processing apparatus, create means for implementing the functions/acts specified in the flowchart and/or block diagram block or blocks.

These computer program instructions may also be stored in a computer readable medium that can direct a computer, other programmable data processing apparatus, or other devices to function in a particular manner, such that the instructions stored in the computer readable medium produce an article of manufacture including instructions which implement the function/act specified in the flowchart and/or block diagram block or blocks.

The computer program instructions may also be loaded onto a computer, other programmable data processing apparatus, or other devices to cause a series of operational steps to be performed on the computer, other programmable apparatus or other devices to produce a computer implemented process such that the instructions which execute on the computer or other programmable apparatus provide processes for implementing the functions/acts specified in the flowchart and/or block diagram block or blocks.

The flowchart and block diagrams in the figures illustrate the architecture, functionality, and operation of possible implementations of systems, methods and computer program products according to various embodiments of the present invention. In this regard, each block in the flowchart or block diagrams may represent a module, segment, or portion of code, which comprises one or more executable instructions for implementing the specified logical function(s). It should also be noted that, in some alternative implementations, the functions noted in the block may occur out of the order noted in the figures. For example, two blocks shown in succession may, in fact, be executed substantially concurrently, or the blocks may sometimes be executed in the reverse order, depending upon the functionality involved. It will also be noted that each block of the block diagrams and/or flowchart illustration, and combinations of blocks in the block diagrams and/or flowchart illustration, can be implemented by special purpose hardware-based systems that perform the specified functions or acts, or combinations of special purpose hardware and computer instructions.

Further, a data processing system suitable for storing and/or executing program code is usable that includes at least one processor coupled directly or indirectly to memory elements through a system bus. The memory elements include, for instance, local memory employed during actual execution of the program code, bulk storage, and cache memory which provide temporary storage of at least some program code in order to reduce the number of times code must be retrieved from bulk storage during execution.

Input/Output or I/O devices (including, but not limited to, keyboards, displays, pointing devices, DASD, tape, CDs, DVDs, thumb drives and other memory media, etc.) can be coupled to the system either directly or through intervening I/O controllers. Network adapters may also be coupled to the system to enable the data processing system to become coupled to other data processing systems or remote printers or storage devices through intervening private or public networks. Modems, cable modems, and Ethernet cards are just a few of the available types of network adapters.

The terminology used herein is for the purpose of describing particular embodiments only and is not intended to be limiting of the invention. As used herein, the singular forms "a", "an" and "the" are intended to include the plural forms as well, unless the context clearly indicates otherwise. It will be further understood that the terms "comprises" and/or "comprising", when used in this specification, specify the presence of stated features, integers, steps, operations, elements, and/or components, but do not preclude the presence or addition of one or more other features, integers, steps, operations, elements, components and/or groups thereof.

The corresponding structures, materials, acts, and equivalents of all means or step plus function elements in the claims below, if any, are intended to include any structure, material, or act for performing the function in combination with other claimed elements as specifically claimed. The description of the present invention has been presented for purposes of illustration and description, but is not intended to be exhaustive or limited to the invention in the form disclosed. Many modifications and variations will be apparent to those of ordinary skill in the art without departing from the scope and spirit of the invention. The embodiment was chosen and described in order to best explain the principles of the invention and the practical application, and to enable others of ordinary skill in the art to understand the invention for various embodiment with various modifications as are suited to the particular use contemplated.

What is claimed is:

1. An apparatus comprising:
    a cooling apparatus, the cooling apparatus being a single-phase-coolant cooling apparatus coupled to a multi-component electronic system comprising at least one primary heat-generating component and a thermally conductive housing component comprising multiple, removable, secondary heat-generating components operatively docked therein, the at least one primary heat-generating component dissipating by design greater heat than a secondary heat-generating component of the multiple, removable, secondary heat-generating components operatively docked within the thermally conductive housing component, the cooling apparatus comprising:
        at least one liquid-cooled cold plate, each liquid-cooled cold plate being coupled to a respective primary heat-generating component of the at least one primary heat-generating component to be cooled;
        a liquid-cooled structure comprising a thermally conductive material with at least one coolant-carrying channel extending therein;
        a thermal conduction structure coupling the thermally conductive housing component comprising the multiple, removable, secondary heat-generating components operatively docked therein and the liquid-cooled structure, the thermal conduction structure comprising a thermal spreader and a thermoelectric array including at least one thermoelectric module, the thermoelectric array facilitating transfer of heat from the thermally conductive housing component comprising the multiple, removable, secondary heat-generating components through the thermal spreader to the liquid-cooled structure, and wherein the thermally conductive structure engages a side surface of the thermally conductive housing component to facilitate the transfer of heat from the side surface of the thermally conductive housing component to the liquid-cooled structure;
        a coolant loop coupled in fluid communication with the at least one coolant-carrying channel extending within the liquid-cooled structure and the at least one liquid-cooled cold plate;
        a single-phase liquid coolant within the coolant loop;
        an outdoor-air-cooled heat exchange unit coupled to facilitate single-phase heat transfer from the single-phase liquid coolant within the coolant loop to the outdoor-air-cooled heat exchange unit, the outdoor-air-cooled heat exchange unit cooling the single-phase coolant passing through the coolant loop by dissipating heat from the coolant to outdoor ambient air; and
        wherein temperature of single-phase coolant entering the at least one liquid-cooled cold plate and entering the liquid-cooled structure from the coolant loop is greater than temperature of the outdoor ambient air to which heat is dissipated.

2. The cooling apparatus of claim 1, wherein the temperature of coolant entering the liquid-cooled structure and entering the at least one liquid-cooled cold plate is greater than or equal to 27° C., and less than or equal to 45° C.

3. The cooling apparatus of claim 1, wherein the multi-component electronic system comprises a plurality of thermally conductive housing components, each comprising multiple, removable, secondary heat-generating components, and the cooling apparatus further comprises a plurality of thermal conduction structures, each thermal conductive structure comprising a respective thermoelectric array as part of a respective thermal conduction path between a respective thermally conductive housing component and the liquid-cooled structure and facilitating transfer of heat from the respective thermally conductive housing component to the liquid-cooled structure.

4. The cooling apparatus of claim 3, wherein the thermally conductive housing components comprise a plurality of data storage devices.

5. The cooling apparatus of claim 4, wherein the plurality of data storage devices are arranged in at least one row within the multi-component electronic system, and one thermal conduction structure of the plurality of thermally conductive structures couples opposing surfaces of two adjacent data storage devices of the plurality of data storage devices to the liquid-cooled structured.

6. The cooling apparatus of claim 1, wherein the thermoelectric array is physically coupled to the side surface of the one thermally conductive housing component and facilitates transferring heat from the side surface to the liquid-cooled structure.

7. The cooling apparatus of claim 6, wherein the thermal spreader is coupled between the thermoelectric array and the liquid-cooled structure, the thermal spreader facilitating conduction of heat from the thermoelectric array to the liquid-cooled structure.

8. The cooling apparatus of claim 1, wherein the thermal spreader is physically coupled to the side surface of the thermally conductive housing component, the thermal spreader facilitating conduction of heat from the side surface to the thermoelectric array.

9. The cooling apparatus of claim 8, wherein the thermal spreader comprises a heat pipe.

10. The cooling apparatus of claim 8, wherein the thermal spreader is a first thermal spreader, and wherein the thermal conduction structure further comprises a second thermal spreader, the second thermal spreader being coupled between the thermoelectric array and the liquid-cooled structure, wherein heat is conducted from the side surface of the thermally conductive structure, through the first heat spreader, across the thermoelectric array, through the second heat spreader, to the liquid-cooled structure.

11. The cooling apparatus of claim 1, further comprising a controller controlling the thermoelectric array, and an adjustable power supply powering the thermoelectric array, the controller being coupled to a temperature sensor for sensing a temperature which facilitates control of cooling of the one secondary heat-generating component, and determining whether the temperature sensed by the temperature sensor is within a defined acceptable temperature range, and responsive to the temperature being outside the defined acceptable temperature range, the controller automatically adjusting a current supplied to the thermoelectric array by the adjustable power supplied to dynamically adjust the transfer of heat across the thermoelectric array to move the temperature sensed by the temperature sensor towards the defined acceptable temperature range.

12. The apparatus of claim 1, wherein the thermally conductive housing component is removable from the multi-component electronic system, and is operatively docked therein in physical contact with the thermal conductive structure engaging its surface.

13. The apparatus of claim 1, wherein the thermal spreader of the thermal conduction structure extends, at least in part, in a direction perpendicular to a longitudinal axis of the liquid-cooled structure.

14. A cooled electronic system comprising:
a multi-component electronic system comprising:
at least one primary heat-generating component;
at least one thermally conductive housing component comprising multiple, removable, secondary heat-generating components, wherein the at least one primary heat-generating component dissipates by design greater heat than one secondary heat-generating component of the multiple, removable, secondary heat-generating components; and
a cooling apparatus, the cooling apparatus being a single-phase-coolant cooling apparatus coupled to the multi-component electronic system, and comprising:
at least one liquid-cooled cold plate, each liquid-cooled cold plate being coupled to a respective primary heat-generating component of the at least one primary heat-generating component to be cooled;
a liquid-cooled structure comprising a thermally conductive material with at least one coolant-carrying channel extending therein;
a thermal conduction structure coupling the thermally conductive housing component comprising the multiple, removable, secondary heat-generating components operatively docked therein and the liquid-cooled structure, the thermal conduction structure comprising a thermal spreader and a thermoelectric array including at least one thermoelectric module, the thermoelectric array facilitating transfer of heat from the thermally conductive housing component, comprising the multiple, removable, secondary heat-generating components, through the thermal spreader to the liquid-cooled structure, and wherein the thermally conductive structure engages a side surface of the thermally conductive housing component to facilitate the transfer of heat from the side surface of the thermally conductive housing to the liquid-cooled structure;
a coolant loop coupled in fluid communication with the at least one coolant-carrying channel extending within the liquid-cooled structure and the at least one liquid-cooled cold plate;
a single-phase liquid coolant within the coolant loop;
an outdoor-air-cooled heat exchange unit coupled to facilitate single-phase heat transfer from the single-phase liquid coolant within the coolant loop to the outdoor-air-cooled heat exchange unit, the outdoor-air-cooled heat exchange unit cooling the single-phase coolant passing through the coolant loop by dissipating heat from the coolant to outdoor ambient air; and
wherein temperature of single-phase coolant entering the at least one liquid-cooled cold plate and entering the liquid-cooled structure from the coolant loop is greater than temperature of the outdoor ambient air to which heat is dissipated.

15. The cooled electronic system of claim 14, wherein the temperature of coolant entering the liquid-cooled structure and entering the at least one liquid-cooled cold plate is greater than or equal to 27° C., and less than or equal to 45° C.

16. The cooled electronic system of claim 15, wherein the multi-component electronic system comprises a plurality of thermally conductive housing components, each comprising multiple, removable, secondary heat-generating components, and the cooling apparatus further comprises a plurality of thermal conduction structures, each thermal conductive structure comprising a respective thermoelectric array as part of a respective thermal conduction path between a respective thermally conductive housing component and the liquid-cooled structure and facilitating transfer of heat from the respective thermally conductive housing component to the liquid-cooled structure.

17. The cooled electronic system of claim 16, wherein the plurality of thermally conductive housing components comprise a plurality of data storage devices arranged in at least one row within the multi-component electronic system, and one thermal conduction structure of the plurality of thermal conduction structures couples opposing surfaces of two adjacent data storage devices of the plurality of data storage devices to the liquid-cooled cold structure.

\* \* \* \* \*